(12) United States Patent
Ding et al.

(10) Patent No.: US 11,728,311 B2
(45) Date of Patent: Aug. 15, 2023

(54) SEMICONDUCTOR DEVICES INCLUDING INTERPOSER SUBSTRATES FURTHER INCLUDING CAPACITORS

(71) Applicant: Samsung Electronics Co., Ltd., Suwon-si (KR)

(72) Inventors: Shaofeng Ding, Seongnam-si (KR); Jeong Hoon Ahn, Seongnam-si (KR); Yun Ki Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 32 days.

(21) Appl. No.: 17/187,985

(22) Filed: Mar. 1, 2021

(65) Prior Publication Data

US 2022/0028827 A1    Jan. 27, 2022

(30) Foreign Application Priority Data

Jul. 21, 2020    (KR) ........................ 10-2020-0090144

(51) Int. Cl.
*H01L 23/522* (2006.01)
*H01L 25/065* (2023.01)
(Continued)

(52) U.S. Cl.
CPC ........ *H01L 25/0652* (2013.01); *H01L 23/481* (2013.01); *H01L 23/49816* (2013.01);
(Continued)

(58) Field of Classification Search
CPC ............. H01L 23/5223; H01L 23/5383; H01L 23/5384; H01L 23/538; H01L 23/49822; H01L 21/76829; H01L 21/76832; H01L 21/76834; H01L 23/5226; H01L 25/0652; H01L 25/0655; H01L 25/0657; H10B 80/00

See application file for complete search history.

(56) References Cited

U.S. PATENT DOCUMENTS

| | | |
|---|---|---|
| 6,111,742 A | 8/2000 | Bonhoure et al. |
| 6,617,628 B2 | 9/2003 | Kim |

(Continued)

*Primary Examiner* — Bradley Smith
*Assistant Examiner* — William Henry Anderson
(74) *Attorney, Agent, or Firm* — Harness, Dickey & Pierce, P.L.C.

(57) ABSTRACT

A semiconductor device includes an interposer substrate and at least one die mounted on the interposer substrate. The interposer substrate includes a semiconductor substrate having a first surface and a second surface opposite to the first surface, an interlayer insulating layer on the first surface of the semiconductor substrate, a capacitor in a hole penetrating the interlayer insulating layer, an interconnection layer on the interlayer insulating layer, and a through-via extending from the interconnection layer toward the second surface of the semiconductor substrate in a vertical direction that is perpendicular to the first surface of the semiconductor substrate. The capacitor includes a sequential stack of a first electrode, a first dielectric layer, a second electrode, a second dielectric layer and a third electrode. A bottom of the hole is distal from the second surface of the semiconductor substrate in relation to the first surface of the semiconductor substrate.

20 Claims, 17 Drawing Sheets

(51) Int. Cl.
*H01L 23/64* (2006.01)
*H01L 23/528* (2006.01)
*H01L 23/498* (2006.01)
*H01L 23/48* (2006.01)

(52) U.S. Cl.
CPC ...... *H01L 23/5223* (2013.01); *H01L 23/5286* (2013.01); *H01L 23/642* (2013.01)

(56) References Cited

U.S. PATENT DOCUMENTS

| | | |
|---|---|---|
| 7,745,924 B2 | 6/2010 | Shioga et al. |
| 8,085,524 B2 | 12/2011 | Roozeboom et al. |
| 8,492,818 B2 | 7/2013 | Wong et al. |
| 9,178,080 B2 | 11/2015 | Kalnitsky et al. |
| 9,209,190 B2* | 12/2015 | Chen ............... H01L 28/40 |
| 9,978,829 B2 | 5/2018 | Lin |
| 10,153,338 B2 | 12/2018 | Chang et al. |
| 10,381,337 B2 | 8/2019 | Shin et al. |
| 2019/0164905 A1 | 5/2019 | Hsieh et al. |
| 2020/0161235 A1* | 5/2020 | Kwon ............... H01L 28/90 |
| 2020/0176557 A1* | 6/2020 | Yin ............... H01L 28/92 |
| 2021/0265262 A1* | 8/2021 | Hsiao ............... H01L 21/31144 |
| 2021/0391413 A1* | 12/2021 | Chen ............... H01G 4/30 |
| 2022/0014095 A1* | 1/2022 | Dabral ............... H02M 3/07 |

\* cited by examiner

SEMICONDUCTOR DEVICES INCLUDING INTERPOSER SUBSTRATES FURTHER INCLUDING CAPACITORS

CROSS-REFERENCE TO RELATED APPLICATION

This U.S. non-provisional patent application claims priority under 35 U.S.C. § 119 to Korean Patent Application No. 10-2020-0090144, filed on Jul. 21, 2020, in the Korean Intellectual Property Office, the disclosure of which is hereby incorporated by reference in its entirety.

BACKGROUND

Example embodiments of the inventive concepts relate to semiconductor devices and methods for manufacturing the same and, more particularly, to semiconductor devices including an interposer substrate.

As high-capacity, thin and small semiconductor devices and electronic products using the same have been increasingly demanded in a semiconductor industry, various package techniques relative thereto have been developed. An integrated circuit chip may be realized in the form of a semiconductor package so as to be appropriately applied to an electronic product. In a typical semiconductor package, a semiconductor chip may be mounted on a printed circuit board (PCB) and may be electrically connected to the PCB through bonding wires or bumps. High-performance, high-speed and small semiconductor packages have been increasingly demanded with the development of an electronic industry.

SUMMARY

Some example embodiments of the inventive concepts may provide a semiconductor device capable of providing improved integration density and improved capacitance.

In some example embodiments, a semiconductor device may include an interposer substrate and at least one die mounted on the interposer substrate. The interposer substrate may include a semiconductor substrate having a first surface and a second surface opposite to the first surface, an interlayer insulating layer on the first surface of the semiconductor substrate, a capacitor in a hole penetrating the interlayer insulating layer, an interconnection layer on the interlayer insulating layer, and a through-via extending from the interconnection layer toward the second surface of the semiconductor substrate in a vertical direction that is perpendicular to the first surface of the semiconductor substrate. The capacitor may include a sequential stack, in the hole penetrating the interlayer insulating layer, of a first electrode, a first dielectric layer, a second electrode, a second dielectric layer, and a third electrode. A bottom of the hole may be distal from the second surface of the semiconductor substrate in relation to the first surface of the semiconductor substrate.

In some example embodiments, a semiconductor device may include an interposer substrate and at least one die mounted on the interposer substrate. The interposer substrate may include a semiconductor substrate having a first surface and a second surface opposite to the first surface, the semiconductor substrate including a capacitor region, a first connection region, a second connection region, and a through-via region. The interposer substrate may include an interlayer insulating layer on the first surface of the semiconductor substrate, a capacitor in the interlayer insulating layer on the capacitor region, an interconnection layer on the interlayer insulating layer, and a through-via at least partially in the through-via region and extending from the interconnection layer toward the second surface of the semiconductor substrate in a vertical direction that is perpendicular to the first surface of the semiconductor substrate. The capacitor may include a sequential stack of a first electrode, a first dielectric layer, a second electrode, a second dielectric layer, and a third electrode. The first connection region and the second connection region may be both located between the capacitor region and the through-via region in a horizontal direction that is parallel to the first surface of the semiconductor substrate, and the second connection region may be located between the capacitor region and the first connection region in the horizontal direction. The first electrode may extend from the capacitor region onto the first connection region, and the first electrode may have an opening on the second connection region. The second electrode may extend from the capacitor region onto the second connection region, and the second electrode on the second connection region may vertically overlap with the opening.

In some example embodiments, a semiconductor device may include a package substrate, an interposer substrate on the package substrate, at least one die mounted on the interposer substrate, a lower pad between the interposer substrate and the package substrate, an external terminal between the lower pad and the package substrate, an upper pad between the interposer substrate and the at least one die, and a connection terminal between the upper pad and the at least one die. The interposer substrate may include a semiconductor substrate having a first surface and a second surface opposite to the first surface, the lower pad on the second surface, an etch stop layer on the first surface of the semiconductor substrate, an interlayer insulating layer on the etch stop layer, a capacitor in a hole penetrating the interlayer insulating layer, wherein a bottom of the hole is distal to the second surface in relation to the first surface based at least in part on the etch stop layer, an interconnection layer on the interlayer insulating layer, and a through-via extending from the interconnection layer to the lower pad. The interconnection layer may include a sequential stack of a plurality of metal layers. Each metal layer of the plurality of metal layers may include at least one interconnection line and a via vertically overlapping with the at least one interconnection line. The upper pad may be on an uppermost metal layer of the plurality of metal layers. The capacitor may include a sequential stack, in the hole, of a first electrode, a first dielectric layer, a second electrode, a second dielectric layer and a third electrode.

BRIEF DESCRIPTION OF THE DRAWINGS

The inventive concepts will become more apparent in view of the attached drawings and accompanying detailed description.

DETAILED DESCRIPTION

Figure 1:
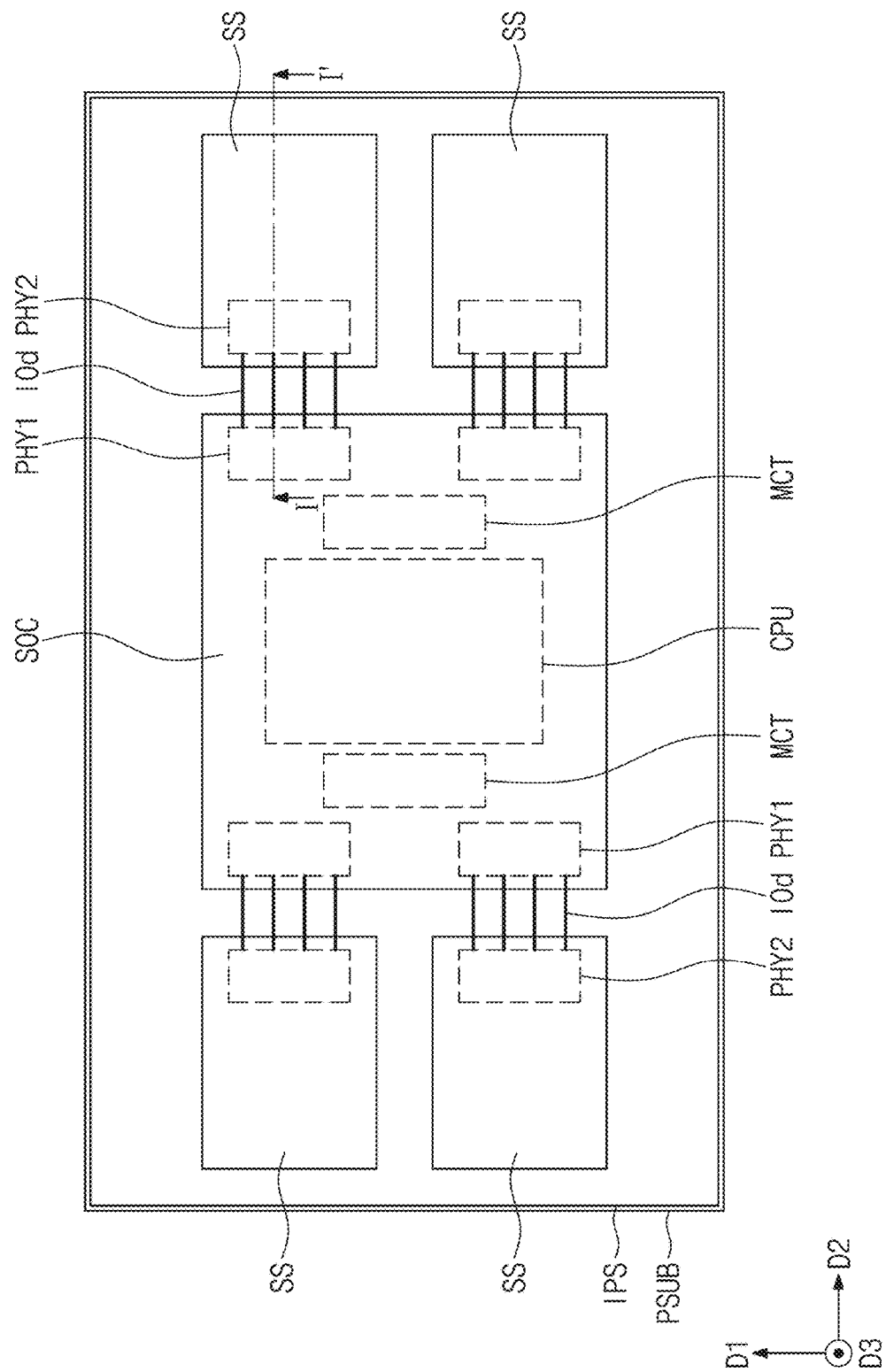
FIG. 1 is a plan view illustrating a semiconductor device according to some example embodiments of the inventive concepts.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances.

Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

As described herein, an element that is "on" or "mounted on" another element may be above, beneath, and/or horizontally adjacent to the other element. Additionally, an element that is "on" another element may be directly on the other element such that the elements are in direct contact with each other or may be indirectly on the other element such that the elements are isolated from direct contact with each other.

Figure 2:
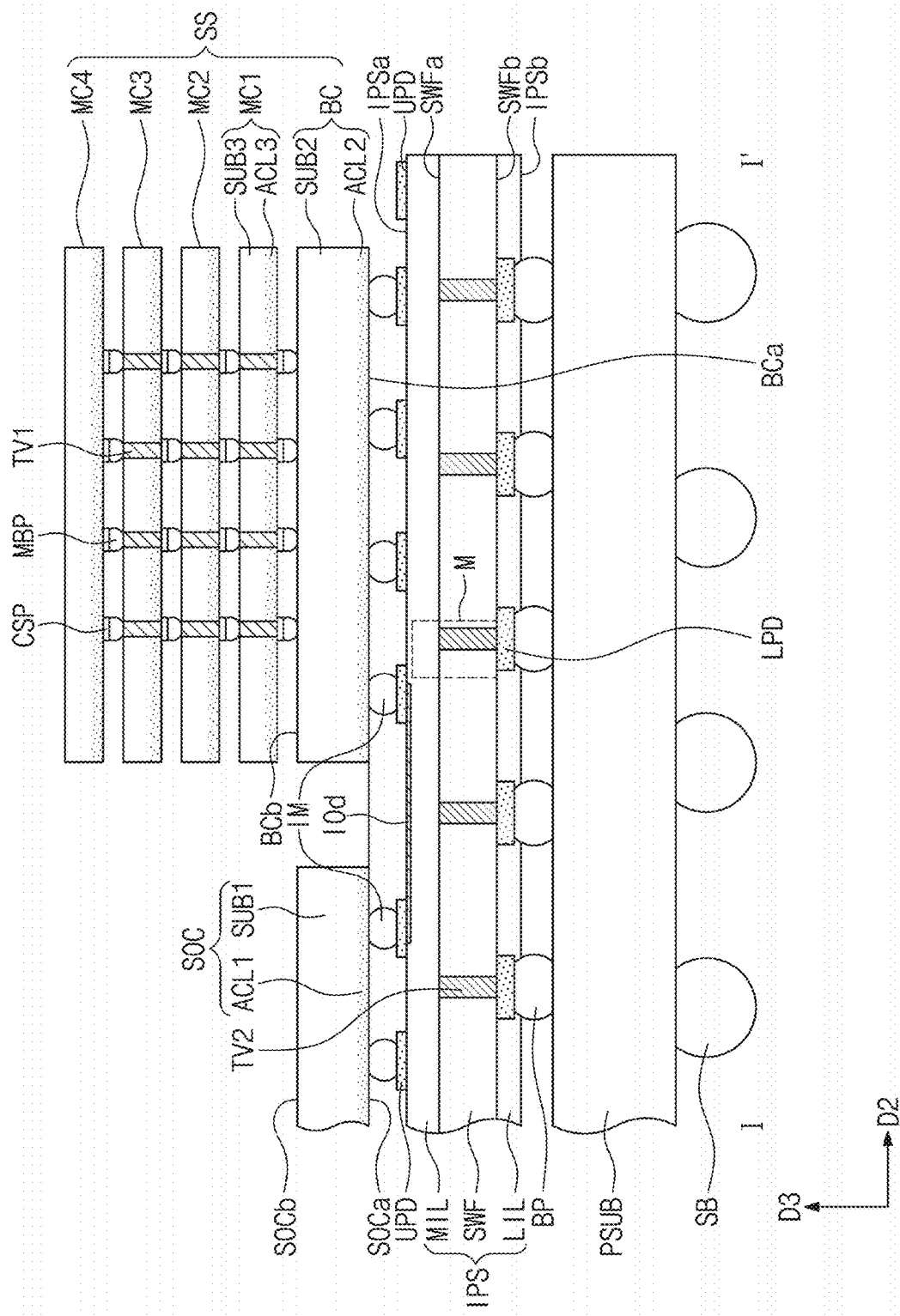
FIG. 2 is a cross-sectional view taken along a line I-I' of FIG. 1 according to some example embodiments of the inventive concepts.
Figure 3:
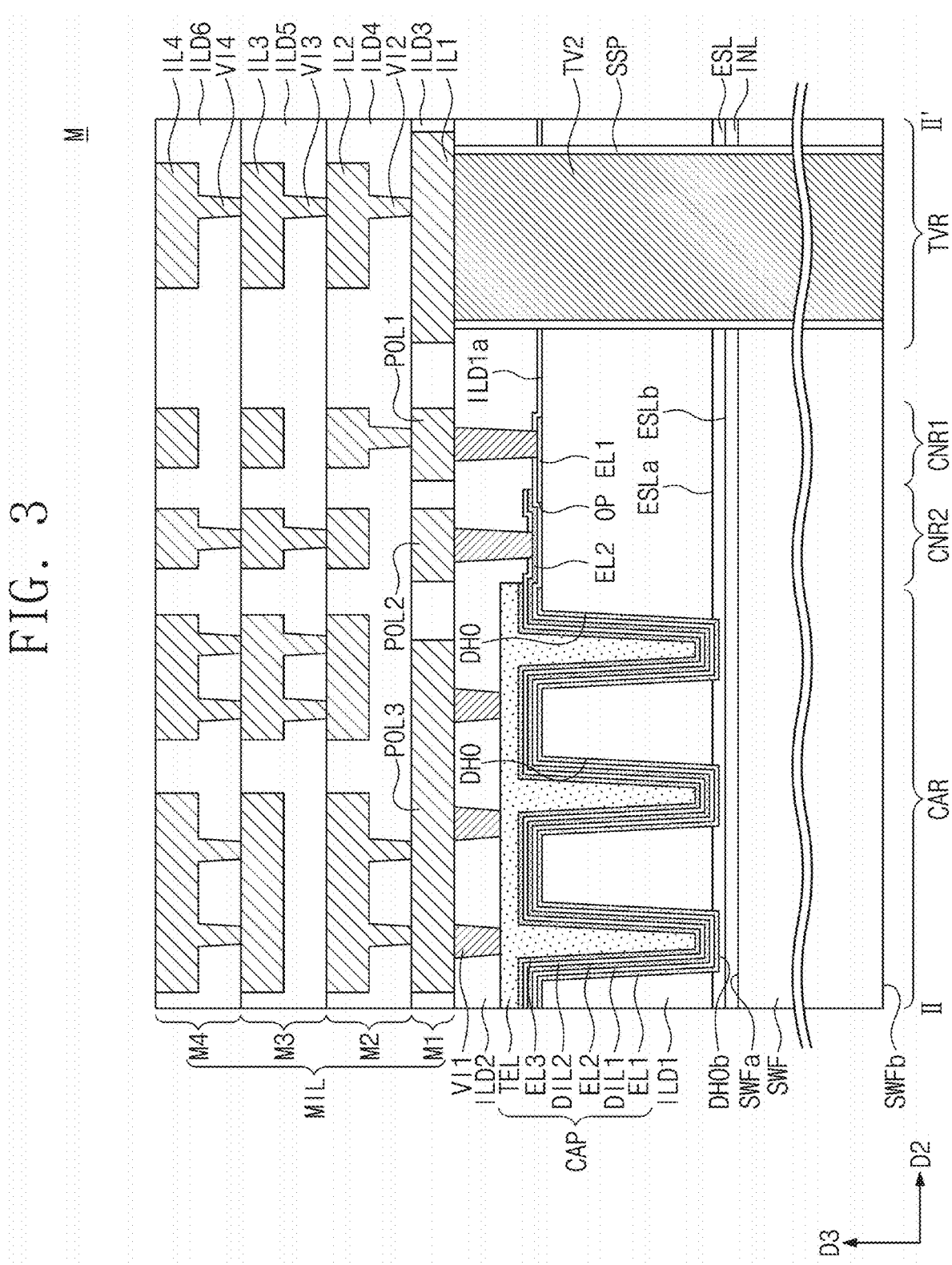
FIG. 3 is an enlarged cross-sectional view of a region 'M' of FIG. 2 to illustrate an interposer substrate according to some example embodiments of the inventive concepts.
Figure 4:
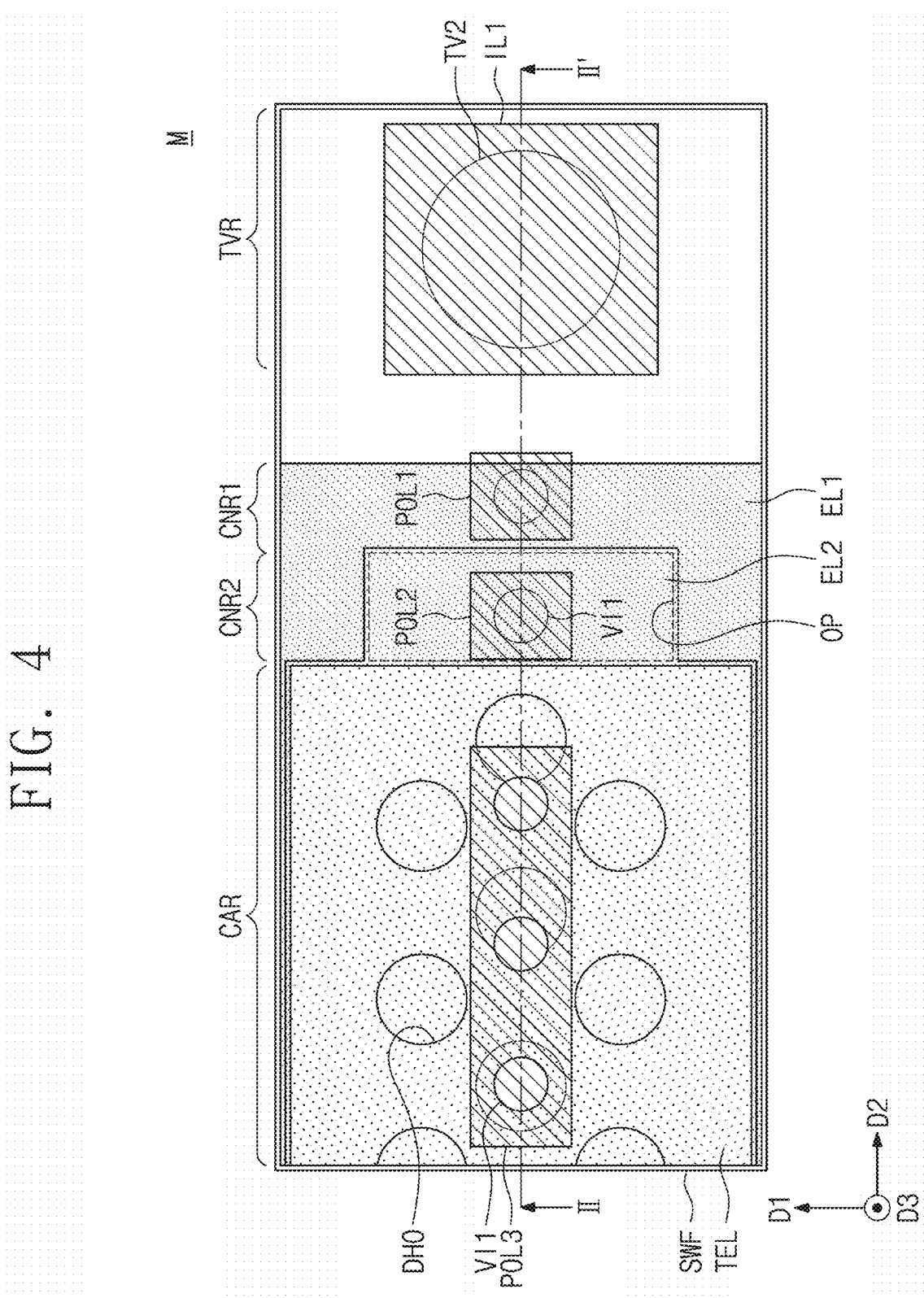
FIG. 4 is a plan view corresponding to the region 'M' of FIG. 2 to illustrate the interposer substrate according to some example embodiments of the inventive concepts.

FIG. 1 is a plan view illustrating a semiconductor device according to some example embodiments of the inventive concepts. FIG. 2 is a cross-sectional view taken along a line I-I' of FIG. 1. FIG. 3 is an enlarged cross-sectional view of a region 'M' of FIG. 2 to illustrate an interposer substrate. FIG. 4 is a plan view corresponding to the region 'M' of FIG. 2 to illustrate the interposer substrate.

A semiconductor device according to some example embodiments of the inventive concepts may include a semiconductor package. In detail, referring to FIGS. 1 and 2, a package substrate PSUB may be provided. An interposer substrate IPS may be provided on the package substrate PSUB. For example, the package substrate PSUB may be a printed circuit board (PCB). The interposer substrate IPS may be a redistribution substrate. The interposer substrate IPS may be a silicon interposer substrate formed using a semiconductor substrate. In some example embodiments, the package substrate PSUB may be omitted from the semiconductor device.

The interposer substrate IPS may have a first surface IPSa and a second surface IPSb opposite to the first surface IPSa. The second surface IPSb may face the package substrate PSUB. First external terminals BP may be provided on the second surface IPSb of the interposer substrate IPS. The first external terminals BP may be disposed between the interposer substrate IPS and the package substrate PSUB. For example, the first external terminals BP may include bumps, respectively.

Second external terminals SB may be provided on a bottom surface of the package substrate PSUB. The second external terminals SB may include solder balls. Even though not shown in the drawings, the package substrate PSUB may include routing interconnection lines and one or more vias therein.

A logic die SOC and a plurality of memory stack structures SS may be mounted on the first surface IPSa of the interposer substrate IPS. For example, four memory stack structures SS may be disposed around the logic die SOC.

However, example embodiments of the inventive concepts are not limited thereto. The number (e.g., quantity) of the memory stack structures SS may be variously changed. The logic die SOC and each of the memory stack structures SS may be collectively referred to as at least one die that is mounted on the first surface IPSa of the interposer substrate IPS. The logic die SOC and each of the memory stack structures SS may be mounted side by side on the interposer substrate IPS, such that the logic die SOC and one or more of the memory stack structures SS may be understood to be adjacent to each other and/or offset from each other in a horizontal direction (e.g., in one or more of the first direction D1 and/or the second direction D2 extending parallel to the first surface SWFa and/or second surface SWFb of the semiconductor substrate SWF).

As shown in FIG. 3, the package substrate PSUB may be beneath the interposer substrate IPS such that the first surface IPSa of the interposer substrate IPS is distal from the package substrate PSUB in relation to the second surface IPSb of the interposer substrate IPS. Thus, as shown in FIG. 3, the interposer substrate IPS may be between the package substrate PSUB and at least one die (e.g., the logic die SOC and/or a memory stack structure SS) in a vertical direction (e.g., the third direction D3).

The logic die SOC may include a central processing unit CPU, a first physical-layer interface region PHY1, and a memory controller MCT. For example, the logic die SOC may be a system-on-chip. The logic die SOC may have a first surface SOCa facing the interposer substrate IPS and a second surface SOCb opposite to the first surface SOCa. The logic die SOC may include a first substrate SUB1 and a first active layer ACL1 on the first substrate SUB1. The first active layer ACL1 may be adjacent to the first surface SOCa. The first substrate SUB1 may be adjacent to the second surface SOCb.

The first active layer ACL1 may include transistors formed on the first substrate SUB1, and an interconnection layer on the transistors. The transistors of the first active layer ACL1 may constitute a logic circuit. The logic die SOC may be mounted on the interposer substrate IPS in a face-down state in which the first active layer ACL1 faces the interposer substrate IPS.

The plurality of memory stack structures SS may have substantially the same structure. Hereinafter, one of the plurality of memory stack structures SS will be described in detail as an example. The memory stack structure SS may include a buffer die BC, and first to fourth memory dies MC1 to MC4 sequentially stacked on the buffer die BC.

The buffer die BC may have a first surface BCa facing the interposer substrate IPS, and a second surface BCb opposite to the first surface BCa. The buffer die BC may include a second substrate SUB2 and a second active layer ACL2 on the second substrate SUB2. The second active layer ACL2 may be adjacent to the first surface BCa. The second substrate SUB2 may be adjacent to the second surface BCb.

The second active layer ACL2 may include transistors formed on the second substrate SUB2, and an interconnection layer on the transistors. The transistors of the second active layer ACL2 may constitute an integrated circuit. The buffer die BC may be mounted on the interposer substrate IPS in a face-down state in which the second active layer ACL2 faces the interposer substrate IPS.

Connection terminals IM may be disposed between the logic die SOC and the interposer substrate IPS and between the buffer die BC and the interposer substrate IPS. For example, each of the connection terminals IM may be a micro bump. The logic die SOC may be mounted on the interposer substrate IPS by a flip-chip bonding method using the connection terminals IM. The buffer die BC may be mounted on the interposer substrate IPS by the flip-chip bonding method using the connection terminals IM. Even though not shown in the drawings, an underfill resin layer may fill a space between the logic die SOC and the interposer substrate IPS and a space between the buffer die BC and the interposer substrate IPS.

Each of the first to fourth memory dies MC1 to MC4 may be a dynamic random access memory (DRAM) chip. According to the present embodiments, the first to fourth memory dies MC1 to MC4 may have substantially the same chip size. In other words, the first to fourth memory dies MC1 to MC4 may have substantially the same planar shape and substantially the same planar size.

Each of the first to fourth memory dies MC1 to MC4 may include a third substrate SUB3 and a third active layer ACL3 on the third substrate SUB3. The third active layer ACL3 may include memory transistors and an interconnection layer on the memory transistors. Each of the first to fourth memory dies MC1 to MC4 may be mounted on the buffer die BC in a face-down state in which the third active layer ACL3 faces the buffer die BC.

Each of the first to third memory dies MC1, MC2 and MC3 may include first through-vias TV1 penetrating therethrough. The fourth memory die MC4 may not include through-vias, but example embodiments of the inventive concepts are not limited thereto. Micro bumps MBP may be provided between the buffer die BC and the first memory die MC1, between the first memory die MC1 and the second memory die MC2, between the second memory die MC2 and the third memory die MC3, and between the third memory die MC3 and the fourth memory die MC4.

The micro bumps MBP may be electrically connected to the first through-vias TV1 of the first to third memory dies MC1, MC2 and MC3 via respective pads CSP. The first to fourth memory dies MC1 to MC4 and the buffer die BC may be electrically connected to each other through the first through-vias TV1, pads CSP, and the micro bumps MBP.

The buffer die BC of the memory stack structure SS may include a second physical-layer interface region PHY2. Data lines IOd may be provided between the first physical-layer interface region PHY1 of the logic die SOC and the second physical-layer interface region PHY2 of the buffer die BC. Data may be exchanged or transmitted between the logic die SOC and the buffer die BC through the data lines IOd. An interconnection layer MIL of the interposer substrate IPS may include the data lines IOd.

The interposer substrate IPS may include a semiconductor substrate SWF, the interconnection layer MIL, and a lower insulating layer LIL. As shown in at least FIG. 2, the semiconductor substrate SWF may have a first surface SWFa and a second surface SWFb opposite to the first surface SWFa. The second surface SWFb of the semiconductor substrate SWF may face the package substrate PSUB. The interconnection layer MIL may be provided on the first surface SWFa of the semiconductor substrate SWF, and the lower insulating layer LIL may be provided on the second surface SWFb of the semiconductor substrate SWF. The semiconductor substrate SWF may be sandwiched between the interconnection layer MIL and the lower insulating layer LIL.

Upper pads UPD may be provided at the first surface IPSa of the interposer substrate IPS and thus may each be between the interposer substrate IPS and at least one die (e.g., logic die SOC and/or memory stack structure SS) in the vertical direction (e.g., third direction D3). The connection terminals IM described above may be disposed on the upper pads UPD, respectively. Accordingly, the connection terminals IM may be between the upper pads UPD and at least one die (e.g., the logic die SOC). Lower pads LPD may be provided at the second surface IPSb of the interposer substrate IPS and thus may each be between the interposer substrate IPS and the package substrate PSUB in the vertical direction (e.g., third direction D3). The first external terminals BP described above may be disposed on the lower pads LPD, respectively. Accordingly, the first external terminals BP may be between the lower pads LPD and the package substrate PSUB.

The interposer substrate IPS may include second through-vias TV2 penetrating the semiconductor substrate SWF. Each of the second through-vias TV2 may vertically extend (e.g., extend in a vertical direction) from the interconnection layer MIL to the lower pad LPD. In other words, the lower pads LPD may be electrically connected to the interconnection layer MIL through the second through-vias TV2.

As described herein, the third direction D3 may be a vertical direction that is perpendicular to the second surface SWFb and/or first surface SWFa of the semiconductor substrate SWF. The first and second directions D1 and D2 may be perpendicular to the third direction D3 and/or parallel to the second surface SWFb and/or first surface SWFa of the semiconductor substrate SWF. The first and second directions D1 and D2 may be perpendicular to each other.

Enlarged views of a region 'M' of the interposer substrate IPS are illustrated in FIGS. 3 and 4. FIG. 3 is a cross-sectional view taken along a line II-II' of FIG. 4. Hereinafter, the interposer substrate IPS according to some example embodiments of the inventive concepts will be described in more detail with reference to FIGS. 3 and 4.

An insulating layer INL and an etch stop layer ESL may be provided on the first surface SWFa of the semiconductor substrate SWF. The insulating layer INL may directly cover (e.g., be directly on) the first surface SWFa. First to sixth interlayer insulating layers ILD1 to ILD6 may be sequentially stacked on the etch stop layer ESL and thus be on the first surface SWFa of the semiconductor substrate SWF.

The semiconductor substrate SWF may include a capacitor region CAR, a first connection region CNR1, a second connection region CNR2, and a through-via region TVR. A plurality of holes DHO may be formed in the first interlayer insulating layer ILD1 on the capacitor region CAR. Each of the holes DHO may penetrate the first interlayer insulating layer ILD1, for example penetrate through an entirety of the thickness (e.g., in the third direction D3) of the first interlayer insulating layer ILD1 as shown in at least FIG. 3. As shown in FIG. 3, each hole DHO may have sidewalls that are at least partially defined by inner sidewall surfaces of the first interlayer insulating layer ILD1 and a bottom surface (e.g., bottom DHOb) that is at least partially defined by a surface, exposed by the hole DHO, of the etch stop layer ESL. Each of the holes DHO may vertically extend from a top surface of the first interlayer insulating layer ILD1 to the etch stop layer ESL via a bottom surface of the first interlayer insulating layer ILD1 and may further extend at least partially into the etch stop layer ESL, for example as shown in FIG. 3. A diameter of each of the holes DHO may become progressively less toward the semiconductor substrate SWF. A bottom DHOb of each of the holes DHO may be spaced apart from the first surface SWFa of the semiconductor substrate SWF (e.g., by at least the etch stop layer ESL). In other words, a level of the bottom DHOb of the hole DHO may be higher than a level of the first surface SWFa of the semiconductor substrate SWF (e.g., the bottom DHOb may be distal to the second surface SWFb of the semiconductor substrate SWF in relation to the first surface SWFa of the semiconductor substrate SWF, based at least in part on the etch stop layer ESL).

As described herein, a "level" of an element may be a vertical distance (e.g., distance in the third direction D3) of the element from the second surface SWFb of the semiconductor substrate SWF. Thus, a level of the bottom DHOb of the hole DHO, that is higher than a level of the first surface SWFa of the semiconductor substrate SWF, will be understood to be distal from the second surface SWFb of the semiconductor substrate SWF in relation to the first surface SWFa of the semiconductor substrate SWF.

A capacitor CAP may be provided in (e.g., located in) the plurality of holes DHO in at least the first interlayer insulating layer ILD1 on (e.g., overlapping with in the third direction D3) the capacitor region CAR of the semiconductor substrate SWF. As shown in FIG. 3, the capacitor CAP located in a hole DHO penetrating the first interlayer insulating layer ILD1 may occupy an entirety of a hole DHO extending through an entire thickness of the first interlayer insulating layer ILD1 (e.g., in the third direction D3). Accordingly, it will be understood that the capacitor CAP may be at least partially within the first interlayer insulating layer ILD1 on the capacitor region CAR. In some example embodiments, the capacitor CAP may include a first electrode EL1, a first dielectric layer DIL1, a second electrode EL2, a second dielectric layer DIL2, a third electrode EL3 and a top electrode TEL, which are sequentially stacked. Restated, and as shown in at least FIG. 3, the capacitor may include a sequential stack, in a hole DHO (e.g., a sequential stack in at least the third direction D3 from a surface of the etch stop layer ESL at least partially defining a bottom of the hole DHO), of at least a first electrode EL1, a first dielectric layer DIL1, a second electrode EL2, a second dielectric layer DIL2, a third electrode EL3, and/or and a top electrode TEL.

Each of the first electrode EL1, the first dielectric layer DIL1, the second electrode EL2, the second dielectric layer DIL2 and the third electrode EL3 may have a substantially uniform thickness in the hole DHO. The first electrode EL1, the first dielectric layer DIL1, the second electrode EL2, the second dielectric layer DIL2 and the third electrode EL3 may not completely fill the hole DHO but may partially fill the hole DHO. The top electrode TEL may completely fill the hole DHO. The first electrode EL1, the first dielectric layer DIL1, the second electrode EL2, the second dielectric layer DIL2, the third electrode EL3 and the top electrode TEL may also be provided on the top surface of the first interlayer insulating layer ILD1.

The first and second connection regions CNR1 and CNR2 of the semiconductor substrate SWF may be located between the capacitor region CAR and the through-via region TVR in a horizontal direction that is parallel to the first surface SWFa and/or second surface SWFb of the semiconductor substrate SWF (e.g., the second direction D2). The second connection region CNR2 may be located between the capacitor region CAR and the first connection region CNR1 in the horizontal direction. The first electrode EL1 may extend from the capacitor region CAR onto the first connection region CNR1. The second electrode EL2 may extend from the capacitor region CAR onto the second connection region CNR2. The second electrode EL2 may not extend onto the first connection region CNR1. The third electrode EL3 and the top electrode TEL may be provided on only the capacitor region CAR. The third electrode EL3 and the top electrode TEL may not extend onto the first and second connection regions CNR1 and CNR2.

First vias VI1 may be provided in the second interlayer insulating layer ILD2. A first metal layer M1 may be provided in the third interlayer insulating layer ILD3. A second metal layer M2 may be provided in the fourth interlayer insulating layer ILD4. A third metal layer M3 may be provided in the fifth interlayer insulating layer ILD5. A fourth metal layer M4 may be provided in the sixth interlayer insulating layer ILD6. The first to fourth metal layers M1 to M4 may constitute the interconnection layer MIL. As shown in FIG. 3, the interconnection layer MIL may include metal layers M1 to M4 that are a sequential stack of a plurality of metal layers. As shown in at least FIG. 3, the interconnection layer MIL may be on (e.g., indirectly on) the first interlayer insulating layer ILD1.

The first metal layer M1, which may be referred to as being a lowermost metal layer of a plurality of metal layers (e.g., M1 to M4) of the interconnection layer MIL, may include a first power interconnection line POL1 on the first connection region CNR1, a second power interconnection line POL2 on the second connection region CNR2, a third power interconnection line POL3 on the capacitor region CAR, and a first interconnection line IL1 on the through-via region TVR.

The first power interconnection line POL1 may be connected (e.g., electrically connected) to the first electrode EL1 on (e.g., overlapping in the third direction D3) the first connection region CNR1 through a corresponding one of the first vias VI1 (e.g., a first via). As shown in FIG. 3, the first electrode EL1 may extend onto (e.g., directly on) a top surface ILD1a of the first interlayer insulating layer ILD1 on the first connection region CNR1 and may be in contact with a corresponding one of the first vias VI1 (e.g., the first via, which may extend through the first dielectric layer DIL1 and the second interlayer insulating layer ILD2). The second power interconnection line POL2 may be connected (e.g., electrically connected) to the second electrode EL2 on (e.g., overlapping in the third direction D3) the second connection region CNR2 through a corresponding one of the first vias VI1 (e.g., a second via, which may extend through the second dielectric layer DIL2 and the second interlayer insulating layer ILD2). As shown in FIG. 3, the second electrode EL2 may extend onto (e.g., indirectly on) the top surface ILD1a of the first interlayer insulating layer ILD1 on the second connection region CNR2 and may be in contact with a corresponding one of the first vias VI1 (e.g., the second via). The third power interconnection line POL3 may be connected (e.g., electrically connected) to the top electrode TEL on (e.g., overlapping in the third direction D3) the capacitor region CAR through a corresponding at least one of the first vias VI1 (e.g., a third via which may extend through the second interlayer insulating layer ILD2). The top electrode TEL may be in contact with the third electrode EL3, and thus the third power interconnection line POL3 may be electrically connected to the third electrode EL3 (e.g., via the third via and the top electrode TEL). The first interconnection line IL1 may be connected to the second through-via TV2 provided in the through-via region TVR.

In some example embodiments, a ground voltage (VSS) may be applied in common to the first power interconnection line POL1 and the third power interconnection line POL3, and a power voltage (VDD) may be applied to the second power interconnection line POL2. In certain embodiments, the power voltage (VDD) may be applied in common to the first power interconnection line POL1 and the third power interconnection line POL3, and the ground voltage (VSS) may be applied to the second power interconnection line POL2. In other words, the first electrode EL1, the first dielectric layer DIL1, the second electrode EL2, the second dielectric layer DIL2 and the third electrode EL3 may constitute a double capacitor in which capacitors are connected in series to each other.

Each of the first, second and third electrodes EL1, EL2 and EL3 may include a conductive metal nitride such as TiN or TaN. Each of the first and second dielectric layers DIL1 and DIL2 may include a high-k dielectric material, for example, hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, lead-zinc niobate, or any combination thereof. The top electrode TEL may include a doped semiconductor material, for example, doped poly-silicon.

Meanwhile, on the second connection region CNR2, the first electrode EL1 may be patterned to have (e.g., define) an opening OP. The first dielectric layer DIL1, the second electrode EL2 and the second dielectric layer DIL2 may be provided in the opening OP. In other words, the first electrode EL1 may be omitted in the opening OP. Thus, the first via VI1 under the second power interconnection line POL2 (e.g., a second via as described herein) may vertically overlap (e.g., overlap in the third direction D3) with the opening OP and may be electrically connected to only the second electrode EL2. If the first electrode EL1 does not have the opening OP on the second connection region CNR2, the first via VI1 under the second power interconnection line POL2 may be connected to the first electrode EL1 as well as the second electrode EL2, and thus an electrical short may occur.

The second through-via TV2 penetrating the semiconductor substrate SWF may be provided at least partially in (e.g., vertically overlapping) the through-via region TVR of the semiconductor substrate SWF. As shown in FIG. 3, the second through-via TV2 may vertically extend (e.g., extend in a vertical direction which may be the third direction D3, which may be perpendicular to the second surface SWFb and/or the first surface SWFa of the semiconductor substrate SWF) from the interconnection layer MIL toward the second surface SWFb of the semiconductor substrate SWF (e.g., at least partially through the first surface SWFa and the thickness of the semiconductor substrate SWF in the vertical direction (e.g., third direction D3). The second through-via TV2 may penetrate the first and second interlayer insulating layers ILD1 and ILD2 as well as the semiconductor substrate SWF. The second through-via TV2 may vertically extend from the first interconnection line IL1 on the through-via region TVR to the second surface SWFb of the semiconductor substrate SWF. A sidewall spacer SSP may be provided on a sidewall of the second through-via TV2. The lower pad LPD illustrated in FIG. 2 may be provided under the second through-via TV2. Thus, as shown in FIG. 2, the second through-via TV2 may vertically extend (e.g., extend in the third direction D3) from the interconnection layer MIL to the lower pad LPD.

The second metal layer M2 may include second interconnection lines IL2 and second vias VI2 under the second interconnection lines IL2 (e.g., in the third direction D3). The second metal layer M2 may be connected to the first metal layer M1 through the second vias VI2. The third metal layer M3 may include third interconnection lines IL3 and third vias VI3 under the third interconnection lines IL3. The third metal layer M3 may be connected to the second metal layer M2 through the third vias VI3. The fourth metal layer M4 may include fourth interconnection lines IL4 and fourth vias VI4 under the fourth interconnection lines IL4. Accordingly, it will be understood that the interconnection layer MIL may include a sequential stack of a plurality of metal layers (e.g., M2 to M4, M1 to M4, etc.) that each include at least one interconnection line and a via vertically overlapping with the at least one interconnection line. The fourth metal layer M4 may be connected to the third metal layer M3 through the fourth vias VI4. The upper pads UPD illustrated in FIG. 2 may be provided on the fourth metal layer M4. Accordingly, it will be understood that the upper pads UPD may each be on the interconnection layer MIL. Referring to FIGS. 203, an upper pad UPD may be on (e.g., directly or indirectly on) an uppermost metal layer (e.g., the fourth metal layer M4) of the plurality of metal layers of the interconnection layer MIL.

According to some example embodiments of the inventive concepts, the highly integrated capacitor CAP embedded in the interposer substrate IPS may be provided. The capacitor CAP according to the inventive concepts may include three electrodes EL1, EL2 and EL3 and two dielectric layers DIL1 and DIL2 therebetween, which may constitute the double capacitor. The capacitor CAP of the inventive concepts may have a capacitance density twice that of a single capacitor having two electrodes and one dielectric layer therebetween.

In addition, since the capacitor CAP of the inventive concepts is the double capacitor, the capacitor CAP may function as a single capacitor even though a voltage is not applied to one of the three electrodes EL1, EL2 and EL3 due to a process defect. In other words, the capacitor CAP may be repaired as a single capacitor by sacrificing one capacitor in the double capacitor.

According to some example embodiments of the inventive concepts, the first, second and third electrodes EL1, EL2 and EL3 may be selectively connected to the first, second and third power interconnection lines POL1, POL2 and POL3, respectively. Particularly, the first electrode EL1 may extend from the capacitor region CAR onto the first interlayer insulating layer ILD1 of the first connection region CNR1. Since only the first electrode EL1 exists on the first connection region CNR1, the first power interconnection line POL1 may be selectively connected to the first electrode EL1. The second electrode EL2 may extend from the capacitor region CAR onto the first interlayer insulating layer ILD1 of the second connection region CNR2. Since only the second electrode EL2 exists on the second connection region CNR2, the second power interconnection line POL2 may be selectively connected to the second electrode EL2.

FIGS. 5, 7, 9, 11, 13 and 15 are plan views illustrating a method for manufacturing an interposer substrate, according to some example embodiments of the inventive concepts. FIGS. 6, 8, 10, 12, 14 and 16 are cross-sectional views taken along lines II-II' of FIGS. 5, 7, 9, 11, 13 and 15, respectively.

Figure 5:
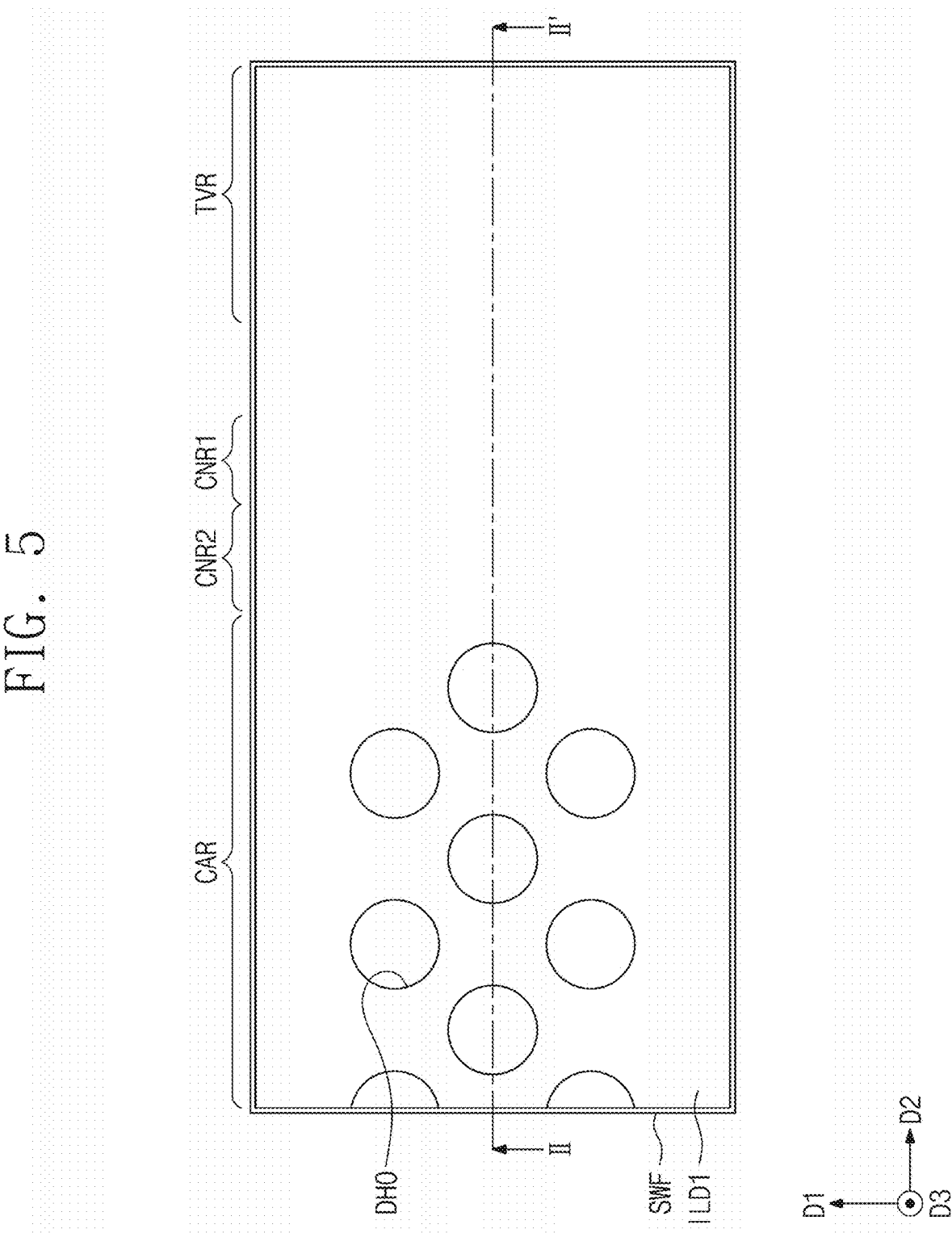
FIGS. 5, 7, 9, 11, 13 and 15 are plan views illustrating a method for manufacturing an interposer substrate, according to some example embodiments of the inventive concepts.
Figure 6:
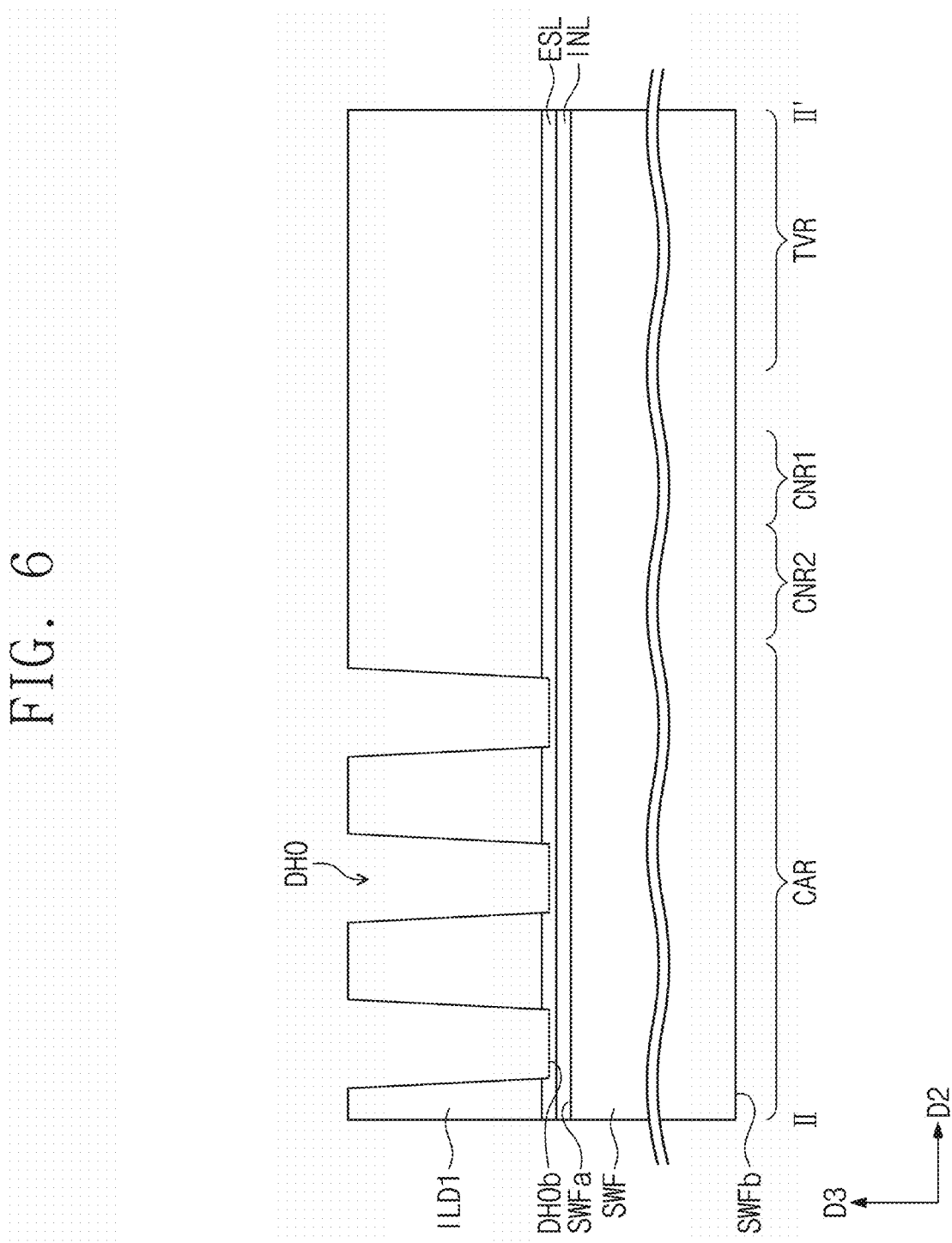
FIGS. 6, 8, 10, 12, 14 and 16 are cross-sectional views taken along lines II-II' of FIGS. 5, 7, 9, 11, 13 and 15, respectively according to some example embodiments of the inventive concepts.

Referring to FIGS. 5 and 6, a semiconductor substrate SWF may be provided. For example, the semiconductor substrate SWF may be a silicon wafer. The semiconductor substrate SWF may have a first surface SWFa and a second surface SWFb opposite to the first surface SWFa. The semiconductor substrate SWF may include a capacitor region CAR, a first connection region CNR1, a second connection region CNR2, and a through-via region TVR. The first and second connection regions CNR1 and CNR2 may be located between the capacitor region CAR and the through-via region TVR.

An insulating layer INL and an etch stop layer ESL may be sequentially formed on the first surface SWFa of the semiconductor substrate SWF. A first interlayer insulating layer ILD1 may be formed on the etch stop layer ESL. For example, the first interlayer insulating layer ILD1 may include a silicon oxide layer, and the etch stop layer ESL may include a silicon nitride layer.

A plurality of holes DHO may be formed in the first interlayer insulating layer ILD1 of the capacitor region CAR. The formation of the plurality of holes DHO may include forming a hard mask defining the plurality of holes DHO on the first interlayer insulating layer ILD1, and performing an anisotropic etching process using the hard mask as an etch mask. The anisotropic etching process may be performed until a bottom DHOb of the hole DHO exposes the etch stop layer ESL. The bottom DHOb of each of the holes DHO may be located at a level (e.g., distance from the second surface SWFb of the semiconductor substrate SWF in the third direction D3) that is between a top surface ESLa and a bottom surface ESLb of the etch stop layer ESL. Restated, the bottom DHOb of each of the holes DHO may be proximate to the second surface SWFb in relation to the top surface ESLa and distal to the second surface SWFb in relation to the bottom surface ESLb in the third direction D3. Further restated, the bottom DHOb of each hole DHO may be between a top surface ESLa of the etch stop layer ESL and a bottom surface ESLb of the etch stop layer ESL in the vertical direction.

Accordingly, as shown in at least FIG. 3, a lowest level of the first electrode EL1 (e.g., the distance in the third direction D3 between the second surface SWFb of the semiconductor substrate SWF and the closest portion of first electrode EL1) may be higher than the first surface SWFa of the semiconductor substrate SWF. Restated, the lowest level of the first electrode EL1 may be distal from the second surface SWFb of the semiconductor substrate SWF in relation to the first surface SWFa of the semiconductor substrate SWF. Additionally, the lowest level of the first electrode EL1 may be between the top surface ESLa and the bottom surface ESLb of the etch stop layer ESL, as shown in FIG. 3.

Figure 7:
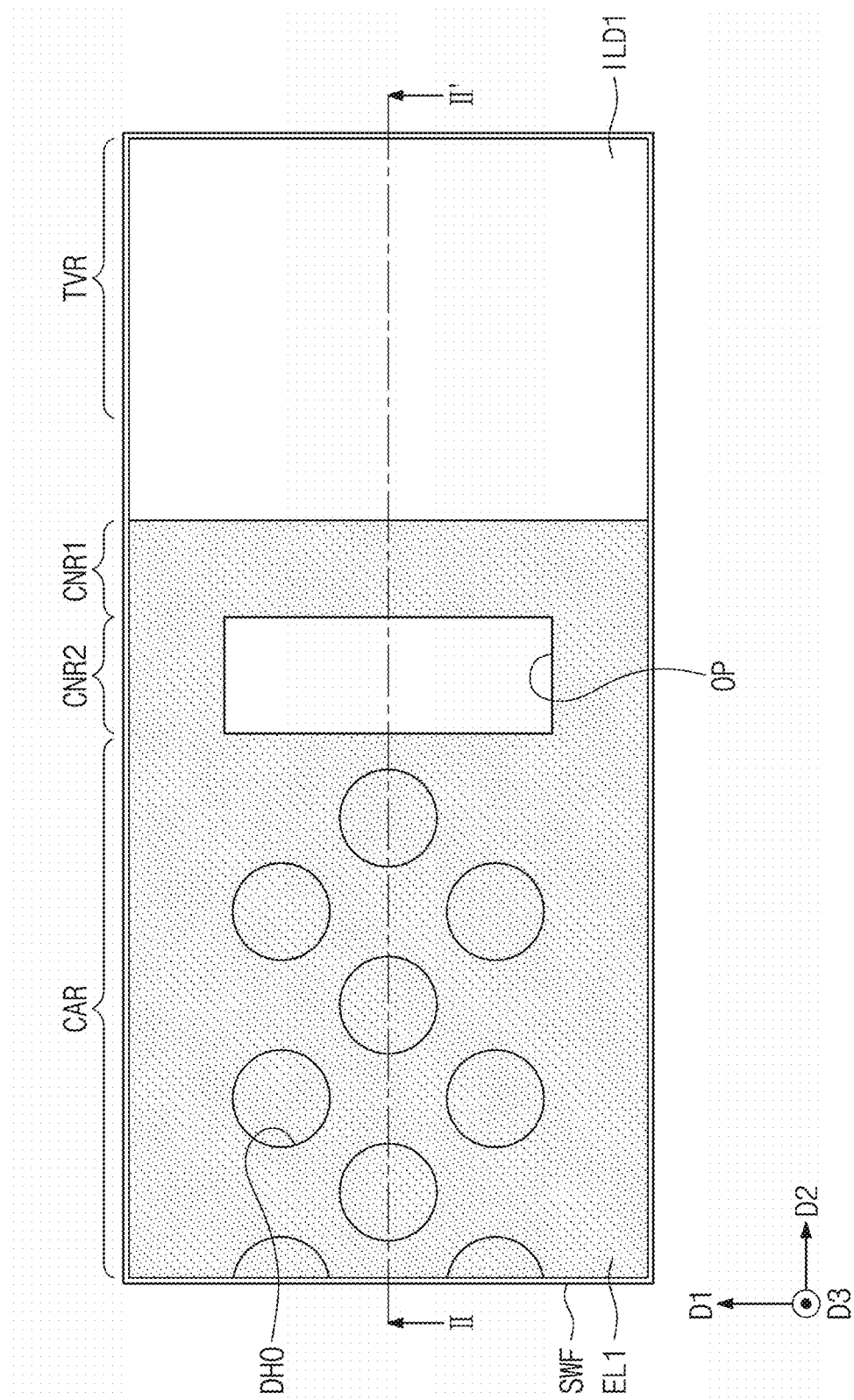
Figure 8:
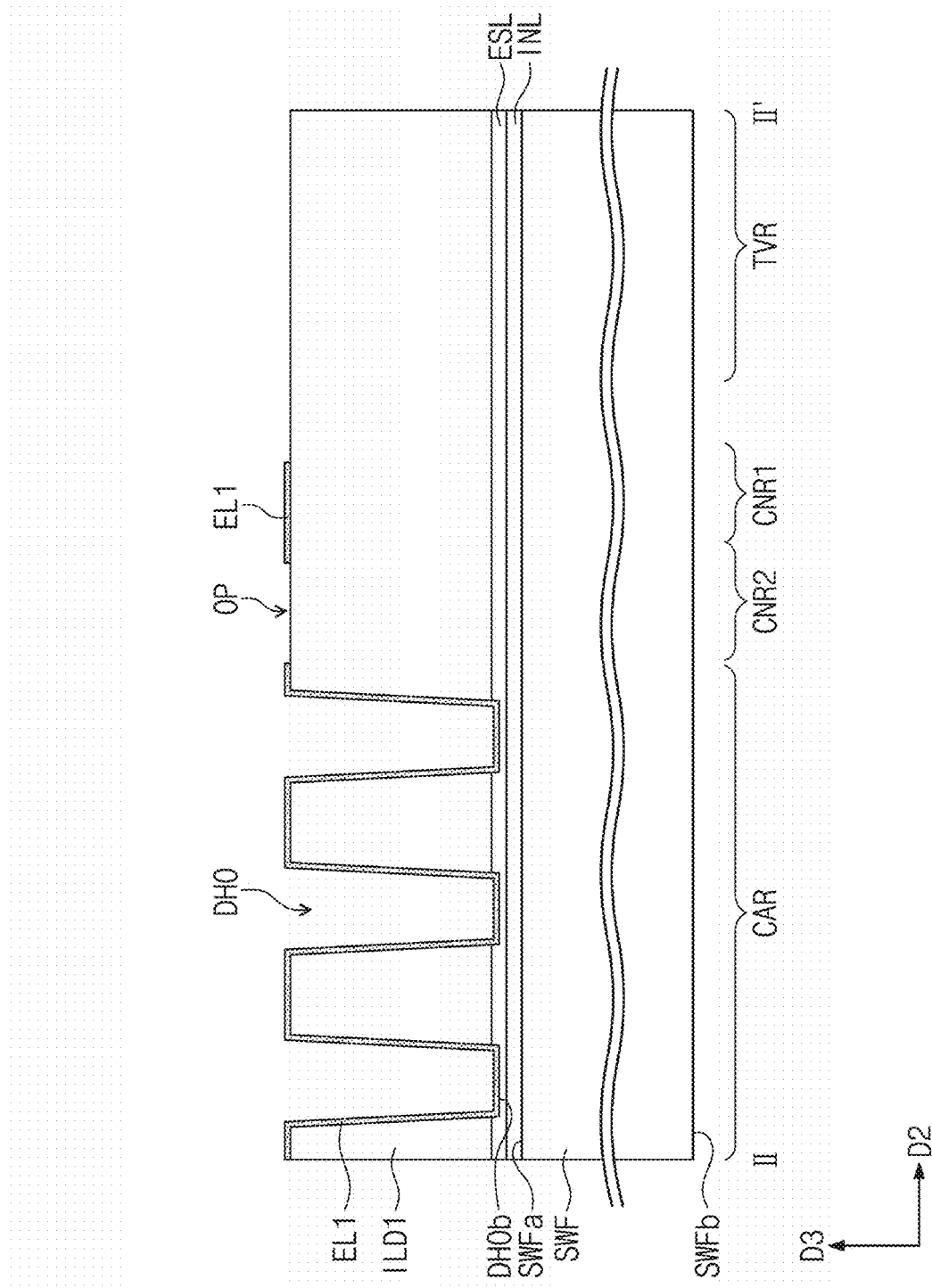

Referring to FIGS. 7 and 8, a first electrode EL1 may be formed on the capacitor region CAR and the first and second connection regions CNR1 and CNR2. The first electrode EL1 may partially fill each of the holes DHO on the capacitor region CAR. The first electrode EL1 may have an opening OP formed on the second connection region CNR2. The opening OP of the first electrode EL1 may expose a top surface of the first interlayer insulating layer ILD1 of the second connection region CNR2.

For example, the formation of the first electrode EL1 may include conformally depositing a first electrode layer on an entire top surface of the semiconductor substrate SWF, and patterning the first electrode layer to form the opening OP. The first electrode layer on the through-via region TVR may be removed during the patterning process.

Figure 9:
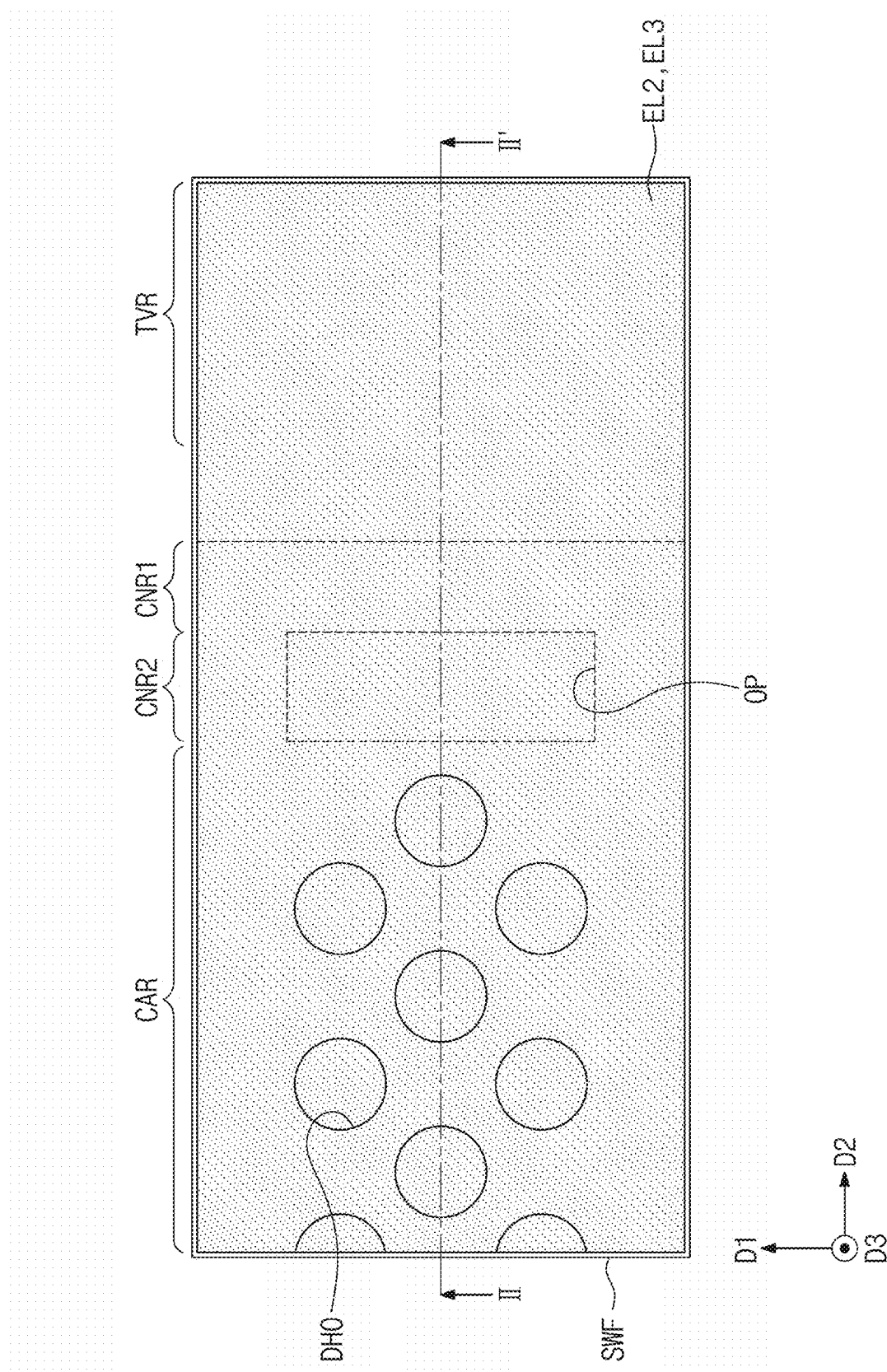
Figure 10:
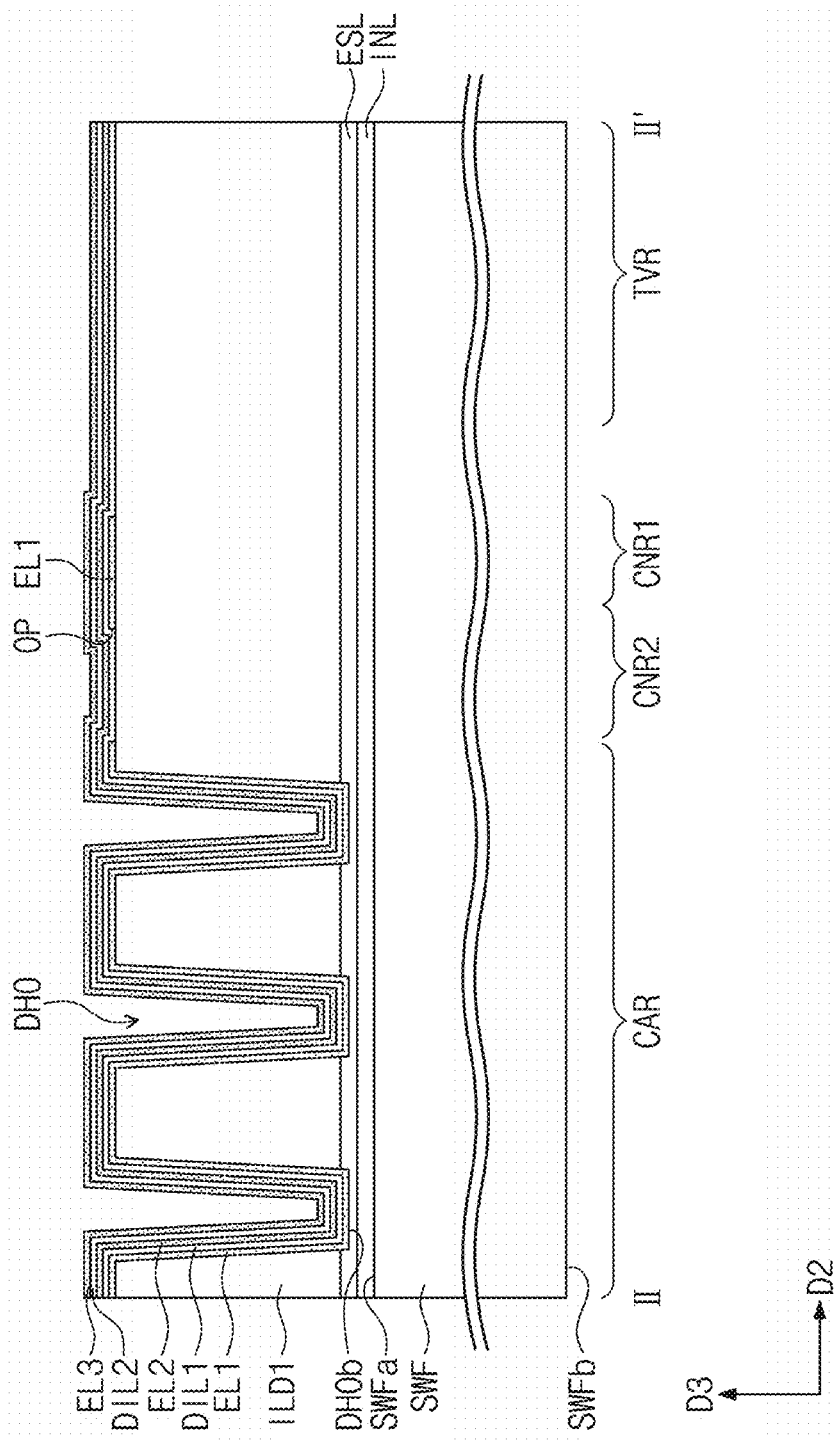

Referring to FIGS. 9 and 10, a first dielectric layer DIL1, a second electrode EL2, a second dielectric layer DIL2 and a third electrode EL3 may be sequentially formed on the first electrode EL1. The layers DIL1 and DIL2 and the electrodes EL2 and EL3 may be conformally deposited on an entire top surface of the semiconductor substrate SWF. The first dielectric layer DIL1, the second electrode EL2, the second dielectric layer DIL2 and the third electrode EL3 may partially fill each of the holes DHO on the capacitor region CAR. Each of the first to third electrodes EL1, EL2 and EL3 may include a conductive metal nitride, and each of the first and second dielectric layers DIL1 and DIL2 may include a high-k dielectric material.

Figure 11:
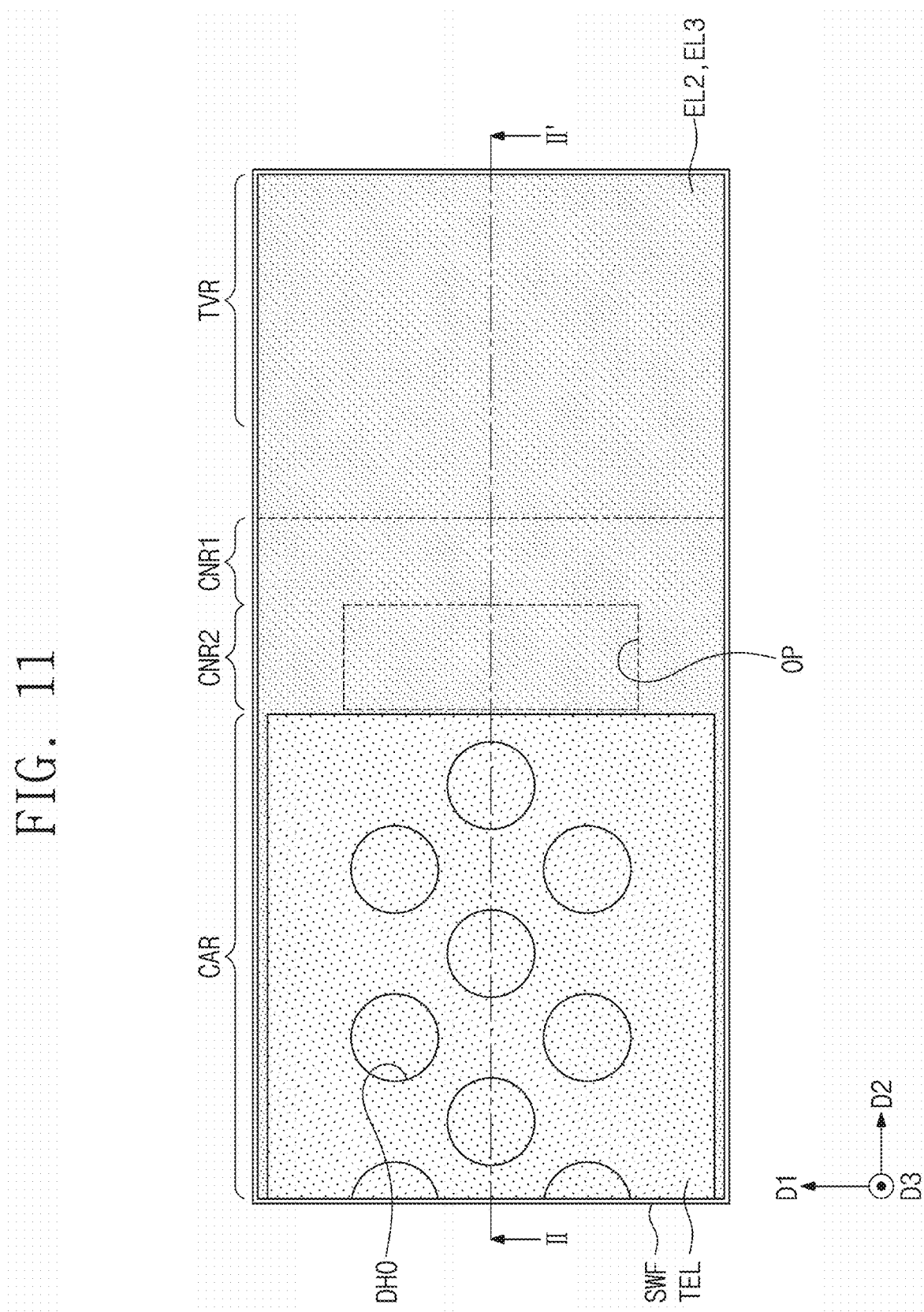
Figure 12:
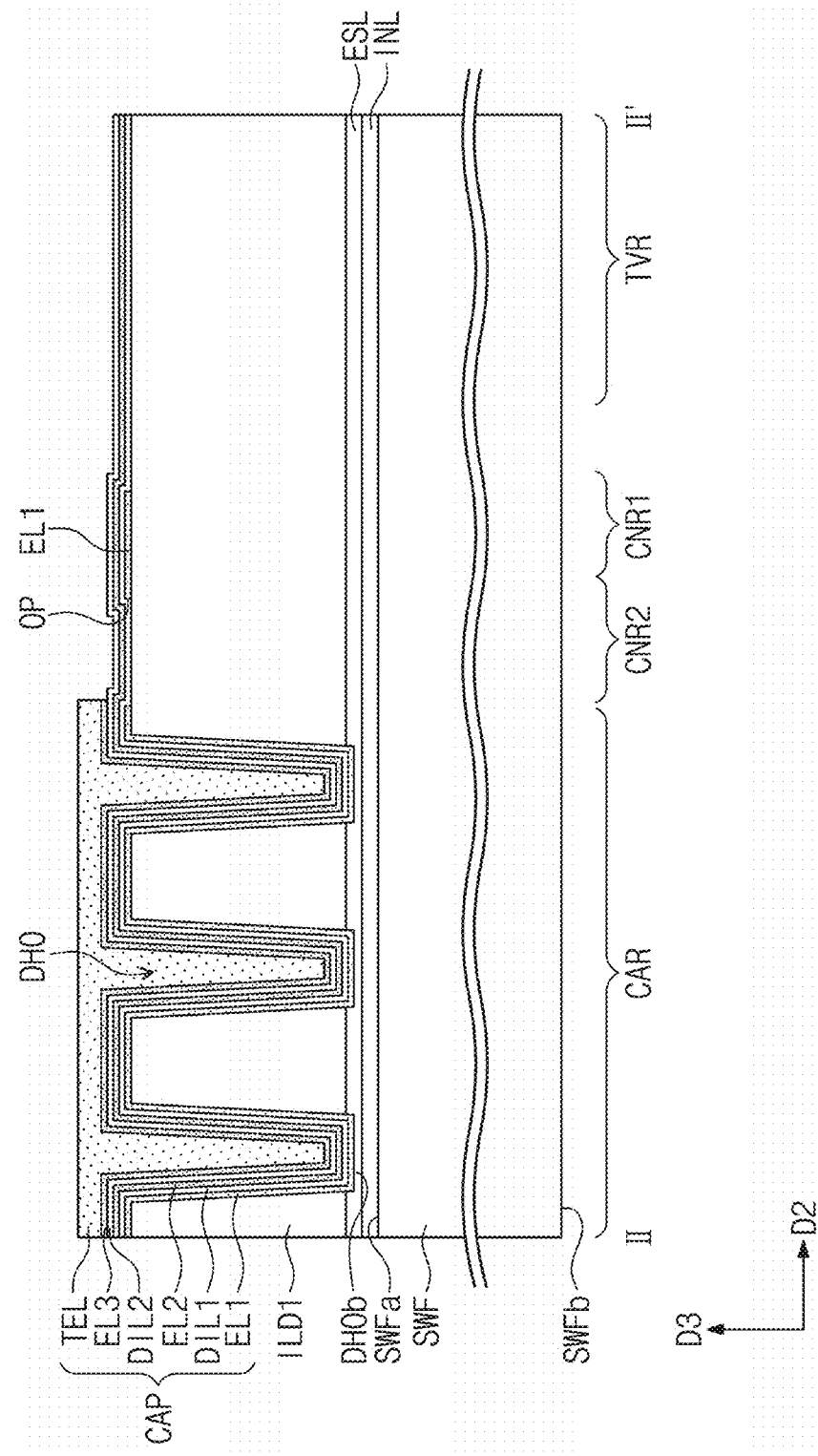

Referring to FIGS. 11 and 12, a top electrode TEL may be formed on the third electrode EL3. The top electrode TEL may be selectively formed on only the capacitor region CAR. The top electrode TEL may completely fill each of the holes DHO on the capacitor region CAR (e.g., may completely fill a remaining portion of the hole DHO defined by the first to third electrodes EL1 to EL3 and first and second dielectric layers DIL1, and DIL2). The top electrode TEL may be in direct contact with the third electrode EL3 of the capacitor region CAR. The top electrode TEL may include a doped semiconductor material, for example, doped polysilicon.

The third electrode EL3 may be selectively patterned using the top electrode TEL as a mask. Thus, the third electrode EL3 may remain on only the capacitor region CAR. In other words, the third electrode EL3 may vertically overlap with the top electrode TEL. The third electrode EL3 on the first and second connection regions CNR1 and CNR2 and the through-via region TVR may be removed to expose the second dielectric layer DIL2.

Figure 13:
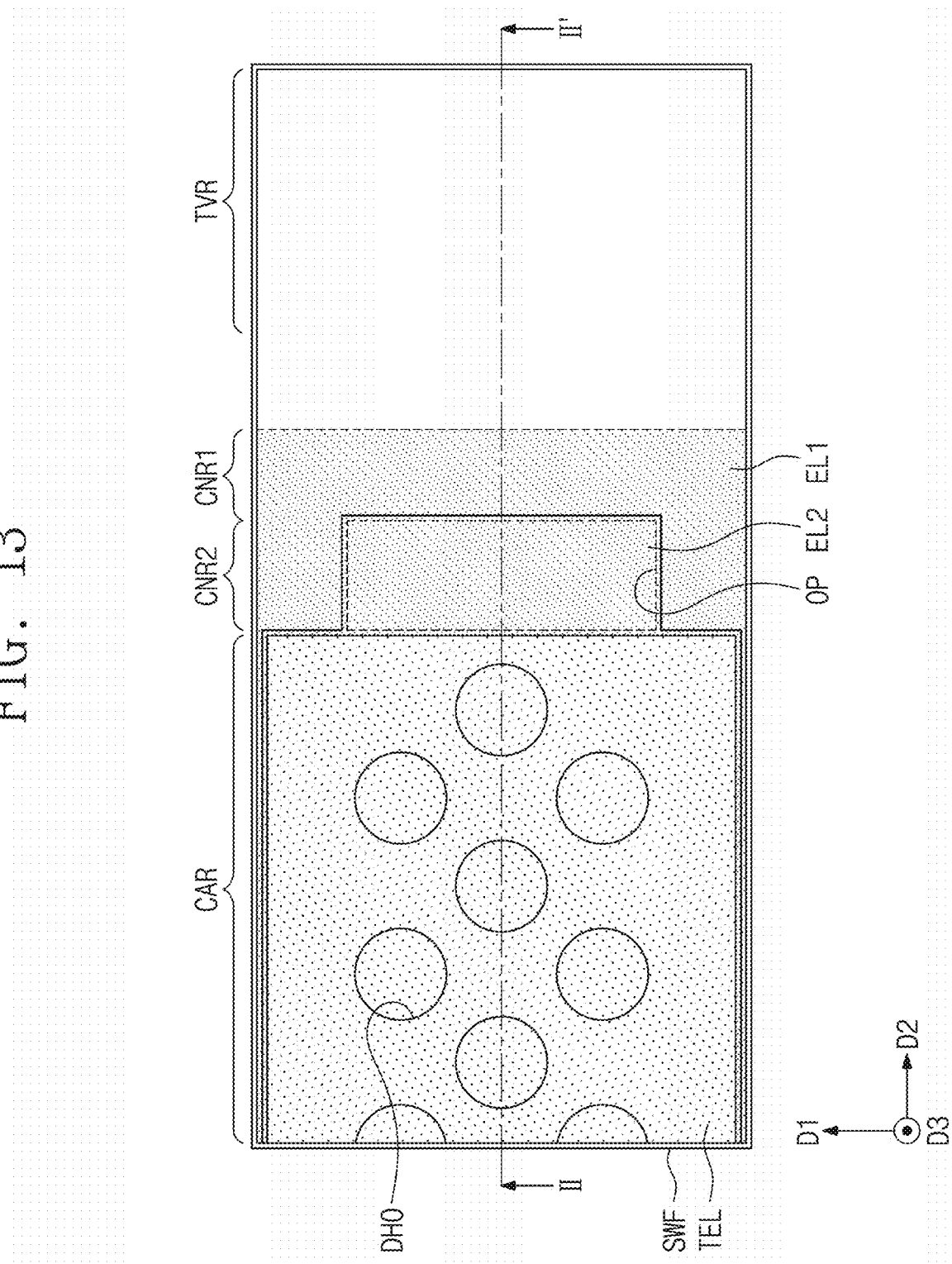
Figure 14:
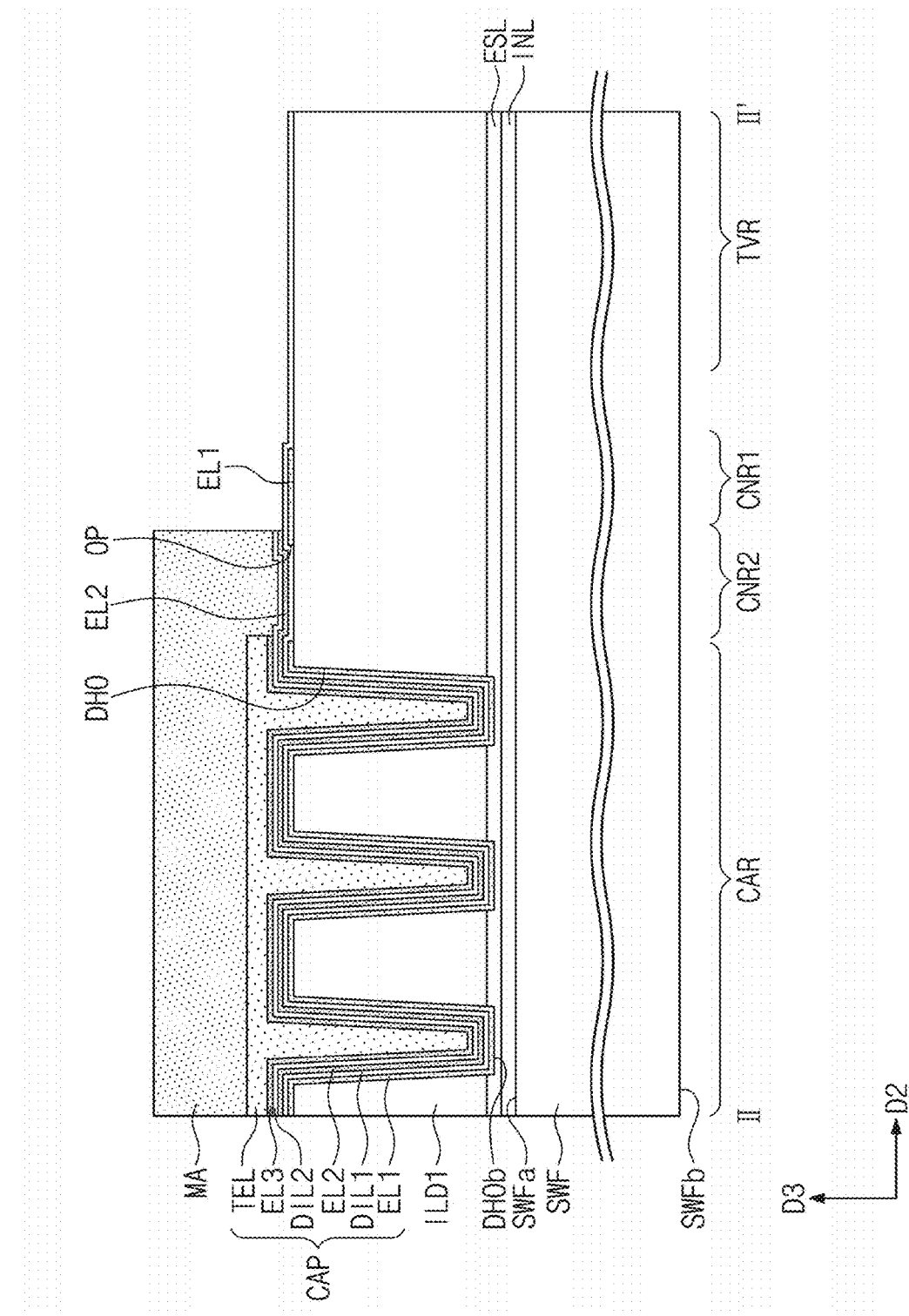

Referring to FIGS. 13 and 14, a mask pattern MA may be formed on the top electrode TEL. The mask pattern MA may be formed to vertically overlap with the opening OP of the first electrode EL1 as well as the capacitor region CAR.

The second dielectric layer DIL2 and the second electrode EL2 may be selectively patterned using the mask pattern MA as a mask. Thus, the second electrode EL2 on the first connection region CNR1 and the through-via region TVR may be removed. The second electrode EL2 on the second connection region CNR2 may vertically overlap with the opening OP of the first electrode EL1. The patterned first to third electrodes EL1, EL2 and EL3, the first and second dielectric layers DIL1 and DIL2 and the top electrode TEL may constitute a capacitor CAP. Thereafter, the mask pattern MA may be removed.

Figure 15:
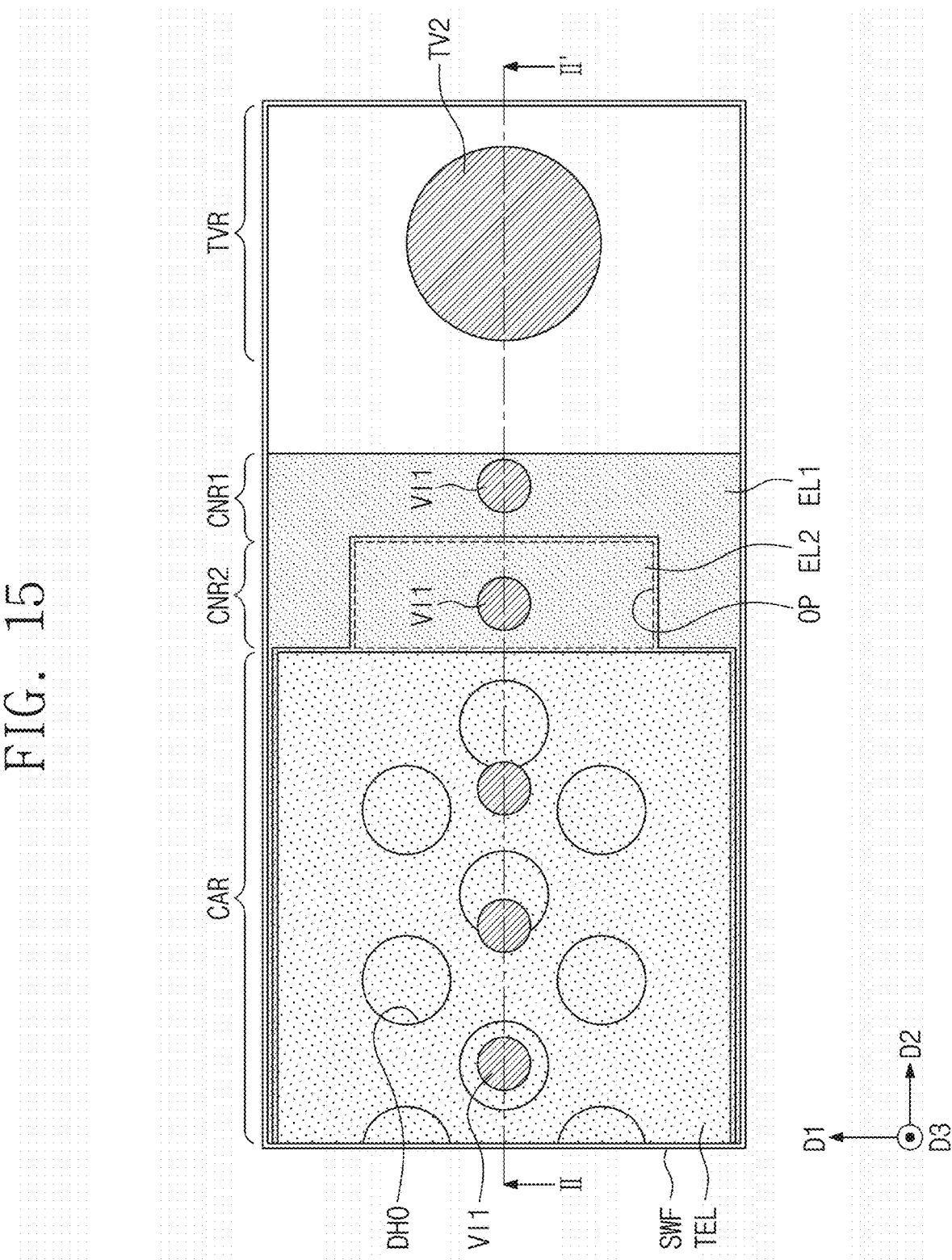
Figure 16:
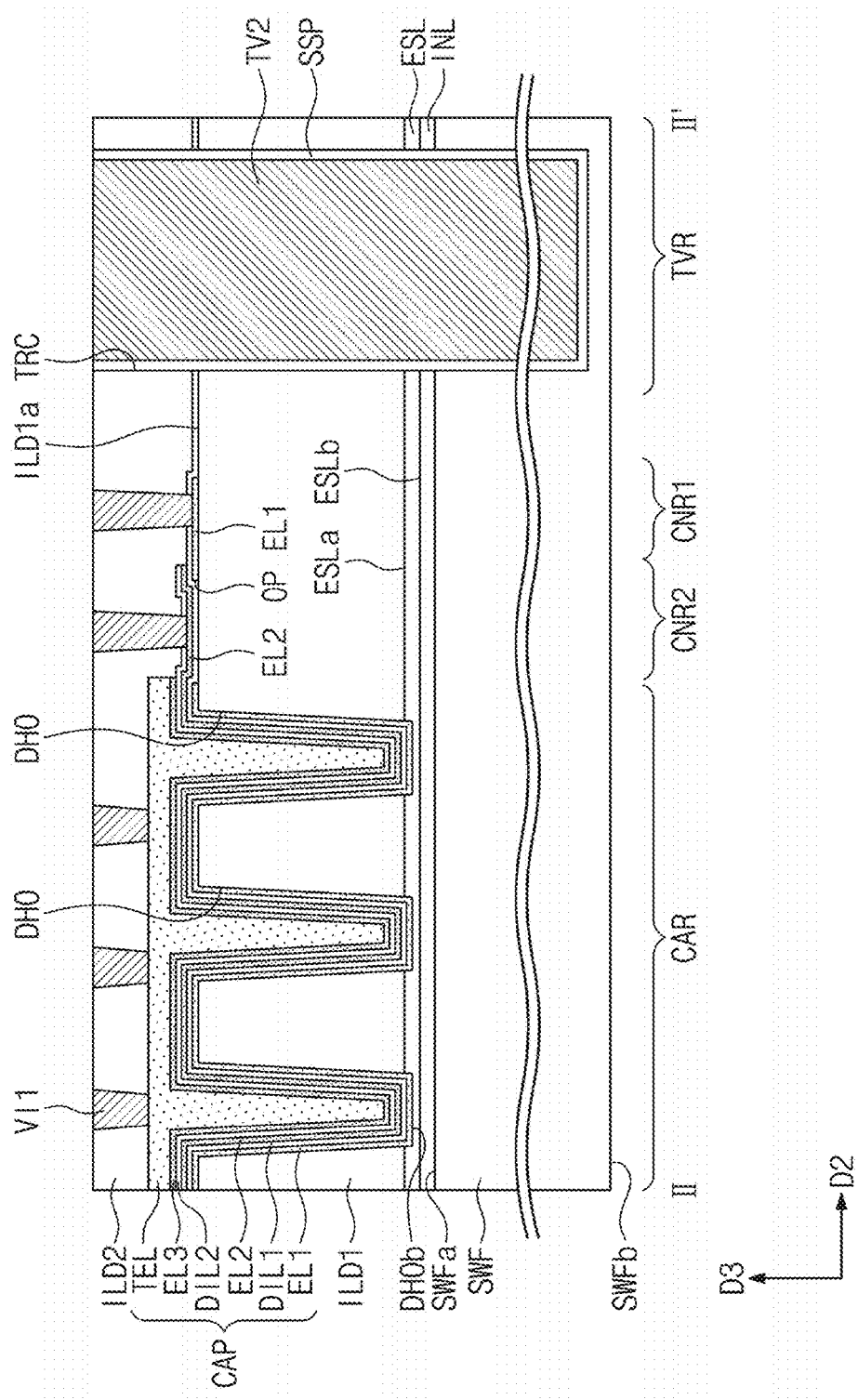

Referring to FIGS. 15 and 16, a second interlayer insulating layer ILD2 covering the capacitor CAP may be formed on the first interlayer insulating layer ILD1. First vias VI1 which penetrate the second interlayer insulating layer ILD2 so as to be connected to the top electrode TEL may be formed on the capacitor region CAR. A first via VI1 connected to the second electrode EL2 may be formed on the second connection region CNR2. A first via VI1 connected to the first electrode EL1 may be formed on the first connection region CNR1.

The first via VI1 on the second connection region CNR2 may be formed to vertically overlap with the opening OP of the first electrode EL1. Thus, the first via VI1 on the second connection region CNR2 may be selectively connected to the second electrode EL2 and may not be connected to the first electrode EL1.

A second through-via TV2 may be formed in the through-via region TVR. Particularly, a trench TRC may be formed in the through-via region TVR. The trench TRC may vertically extend from a top surface of the second interlayer insulating layer ILD2 toward the second surface SWFb of the semiconductor substrate SWF. The trench TRC may not completely penetrate the semiconductor substrate SWF.

A sidewall spacer SSP may be conformally formed in the trench TRC. The sidewall spacer SSP may include an insulating material, for example, silicon oxide and/or silicon nitride. After the formation of the sidewall spacer SSP, the second through-via TV2 may be formed by filling the trench TRC with a conductive material.

Referring again to FIGS. 3 and 4, a third interlayer insulating layer ILD3 may be formed on the second interlayer insulating layer ILD2. A first metal layer M1 may be formed in the third interlayer insulating layer ILD3. The formation of the first metal layer M1 may include forming a first power interconnection line POL1 on the first connection region CNR1, a second power interconnection line POL2 on the second connection region CNR2, a third power interconnection line POL3 on the capacitor region CAR, and a first interconnection line IL1 on the through-via region TVR.

A fourth interlayer insulating layer ILD4 may be formed on the third interlayer insulating layer ILD3. A second metal layer M2 may be formed in the fourth interlayer insulating layer ILD4. The formation of the second metal layer M2 may include forming second interconnection lines IL2. A fifth interlayer insulating layer ILD5 may be formed on the fourth interlayer insulating layer ILD4. A third metal layer M3 may be formed in the fifth interlayer insulating layer ILD5. The formation of the third metal layer M3 may include forming third interconnection lines IL3. A sixth interlayer insulating layer ILD6 may be formed on the fifth interlayer insulating layer ILD5. A fourth metal layer M4 may be formed in the sixth interlayer insulating layer ILD6. The formation of the fourth metal layer M4 may include forming fourth interconnection lines IL4. Thereafter, a chemical mechanical polishing (CMP) process may be performed on the second surface SWFb of the semiconductor substrate SWF to expose a bottom surface of the second through-via TV2.

Figure 17:
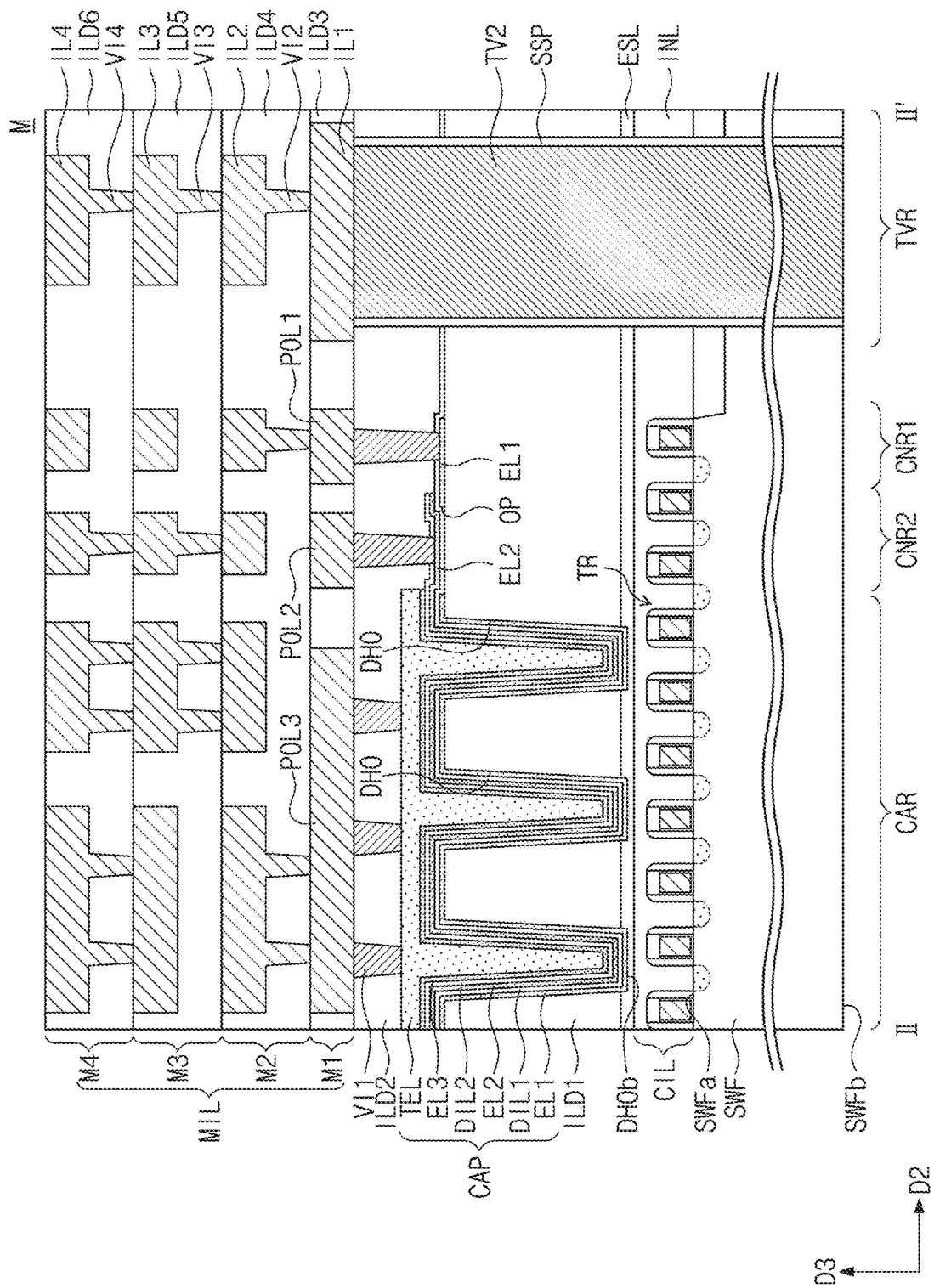
FIG. 17 is an enlarged cross-sectional view of the region 'M' of FIG. 2 to illustrate an interposer substrate according to some example embodiments of the inventive concepts.

FIG. 17 is an enlarged cross-sectional view of the region 'M' of FIG. 2 to illustrate an interposer substrate according to some example embodiments of the inventive concepts. In the present embodiments, the descriptions to the same technical features as in some example embodiments of FIGS. 3 and 4 will be omitted for the purpose of ease and convenience in explanation. In other words, differences between the present embodiments and some example embodiments of FIGS. 3 and 4 will be mainly described in detail.

Referring to FIG. 17, a circuit layer CIL may be provided on the semiconductor substrate SWF, for example between the first surface SWFa of the semiconductor substrate SWF and the first interlayer insulating layer ILD1 in the third direction D3. The circuit layer CIL may include a plurality of transistors TR formed on (e.g., directly on) the first surface SWFa of the semiconductor substrate SWF. An upper portion of the semiconductor substrate SWF may function as an active region of each of the transistors TR. The transistors TR may be provided on the capacitor region CAR and the first and second connection regions CNR1 and CNR2. The insulating layer INL may cover the transistors TR.

The circuit layer CIL according to the present embodiments may be provided under the capacitor CAP, such that the capacitor CAP is understood to vertically overlap (e.g., overlap in the third direction D3) with the circuit layer CIL. At least one of the transistors TR may vertically overlap with the capacitor CAP. In other words, the circuit layer CIL and the capacitor CAP may be formed at different levels and thus may be stacked to vertically overlap with each other. As a result, an integration density of the interposer substrate IPS may be improved.

The interposer substrate according to the inventive concepts may include the embedded double capacitor. A capacitance of the double capacitor may be twice that of a single capacitor having the same area as the double capacitor. In addition, even though a defect occurs at one of three electrodes of the double capacitor, the double capacitor may be repaired as a single capacitor by the other electrodes. In the interposer substrate according to the inventive concepts, the capacitor may be provided in the interlayer insulating layer spaced apart from the semiconductor substrate. Thus, the circuit layer may be additionally formed between the capacitor and the semiconductor substrate. As a result, the integration density of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device, comprising:
an interposer substrate; and
at least one die mounted on the interposer substrate,
wherein the interposer substrate includes
a semiconductor substrate having a first surface and a second surface opposite to the first surface,
an interlayer insulating layer on the first surface of the semiconductor substrate,
a capacitor in a hole penetrating the interlayer insulating layer,
an interconnection layer on the interlayer insulating layer, and
a through-via extending from the interconnection layer toward the second surface of the semiconductor substrate in a vertical direction that is perpendicular to the first surface of the semiconductor substrate,
wherein the hold penetrating the interlayer insulating layer extends in the vertical direction and includes sidewalls at least partially defined by an inner sidewall surface and a bottom surface,
wherein the capacitor includes a sequential stack, of a first electrode, a first dielectric layer, a second electrode, a second dielectric layer, and a third electrode, that is at least partially in the hole penetrating the interlayer insulating layer and extending along the inner sidewall surface and the bottom surface of the hole penetrating the interlayer insulating layer, and
wherein the capacitor is spaced apart from the semiconductor substrate, such that a bottom of the hole is distal from the second surface of the semiconductor substrate in relation to the first surface of the semiconductor substrate and the first surface of the semiconductor substrate is between the bottom of the hole and the second surface of the semiconductor substrate.

2. The semiconductor device of claim 1, wherein
the interconnection layer includes, in a first metal layer, a first power interconnection line, a second power interconnection line and a third power interconnection line,
the first power interconnection line is electrically connected to the first electrode,
the second power interconnection line is electrically connected to the second electrode, and
the third power interconnection line is electrically connected to the third electrode.

3. The semiconductor device of claim 2, wherein
the semiconductor substrate includes a capacitor region, a first connection region, and a second connection region,
the capacitor is in the interlayer insulating layer on the capacitor region, and
the interposer substrate further includes
a first via connecting the first power interconnection line to the first electrode on the first connection region, and
a second via connecting the second power interconnection line to the second electrode on the second connection region.

4. The semiconductor device of claim 3, wherein
the first electrode extends onto a top surface of the interlayer insulating layer on the first connection region and is in contact with the first via, and
the second electrode extends onto the top surface of the interlayer insulating layer on the second connection region and is in contact with the second via.

5. The semiconductor device of claim 4, wherein
the first electrode has an opening on the second connection region, and
the second electrode on the second connection region vertically overlaps with the opening.

6. The semiconductor device of claim 3, wherein
the capacitor further includes a top electrode on the third electrode,
the top electrode completely fills the hole, and
the interposer substrate further includes a third via connecting the third power interconnection line to the top electrode on the capacitor region.

7. The semiconductor device of claim 1, wherein
the interposer substrate further includes an etch stop layer between the first surface and the interlayer insulating layer, and
the bottom of the hole is between a top surface of the etch stop layer and a bottom surface of the etch stop layer in the vertical direction.

8. The semiconductor device of claim 1, wherein
the interposer substrate further includes a circuit layer between the first surface and the interlayer insulating layer in the vertical direction,
the circuit layer includes a plurality of transistors on the first surface, and
the capacitor vertically overlaps with the circuit layer.

9. The semiconductor device of claim 1, wherein the at least one die includes a logic die and a memory stack structure which are both on the interposer substrate and which are adjacent to each other in a horizontal direction that is perpendicular to the vertical direction.

10. The semiconductor device of claim 1, further comprising:
a package substrate beneath the interposer substrate such that the interposer substrate is between the package substrate and the at least one die in the vertical direction;
an upper pad between the interposer substrate and the at least one die in the vertical direction; and
a lower pad between the interposer substrate and the package substrate in the vertical direction,
wherein the upper pad is on the interconnection layer, and
wherein the through-via vertically extends from the interconnection layer to the lower pad.

11. A semiconductor device, comprising:
an interposer substrate; and
at least one die mounted on the interposer substrate,
wherein the interposer substrate includes
- a semiconductor substrate having a first surface and a second surface opposite to the first surface, the semiconductor substrate including a capacitor region, a first connection region, a second connection region, and a through-via region,
- an interlayer insulating layer on the first surface of the semiconductor substrate,
- a capacitor in the interlayer insulating layer on the capacitor region,
- an interconnection layer on the interlayer insulating layer, and
- a through-via at least partially in the through-via region and extending from the interconnection layer toward the second surface of the semiconductor substrate in a vertical direction that is perpendicular to the first surface of the semiconductor substrate, wherein the capacitor includes a sequential stack of a first electrode, a first dielectric layer, a second electrode, a second dielectric layer, and a third electrode,
wherein the first connection region and the second connection region are both located between the capacitor region and the through-via region in a horizontal direction that is parallel to the first surface of the semiconductor substrate, and the second connection region is located between the capacitor region and the first connection region in the horizontal direction,
wherein the first electrode extends from the capacitor region onto the first connection region, and the first electrode has an opening on the second connection region,
wherein the second electrode extends from the capacitor region onto the second connection region, and the second electrode on the second connection region vertically overlaps with the opening.

12. The semiconductor device of claim 11, wherein a lowest level of the first electrode is higher than the first surface.

13. The semiconductor device of claim 12, wherein
the interposer substrate further includes an etch stop layer between the first surface and the interlayer insulating layer, and
the lowest level of the first electrode is between a top surface and a bottom surface of the etch stop layer.

14. The semiconductor device of claim 11, wherein
the first electrode on the first connection region is on a top surface of the interlayer insulating layer, and
the second electrode on the second connection region is on the top surface of the interlayer insulating layer.

15. The semiconductor device of claim 11, wherein
the interconnection layer includes, in a first metal layer, a first power interconnection line, a second power interconnection line and a third power interconnection line, and
wherein the interposer substrate further includes
- a first via connecting the first power interconnection line to the first electrode on the first connection region,
- a second via connecting the second power interconnection line to the second electrode on the second connection region, and
- a third via electrically connecting the third power interconnection line to the third electrode on the capacitor region.

16. A semiconductor device, comprising:
a package substrate;
an interposer substrate on the package substrate;
at least one die mounted on the interposer substrate;
a lower pad between the interposer substrate and the package substrate;
an external terminal between the lower pad and the package substrate;
an upper pad between the interposer substrate and the at least one die; and
a connection terminal between the upper pad and the at least one die,
wherein the interposer substrate includes
- a semiconductor substrate having a first surface and a second surface opposite to the first surface, the lower pad on the second surface,
- an etch stop layer on the first surface of the semiconductor substrate,
- an interlayer insulating layer on the etch stop layer,
- a capacitor in a hole penetrating the interlayer insulating layer, wherein a bottom of the hole is distal to the second surface in relation to the first surface based at least in part on the etch stop layer,
- an interconnection layer on the interlayer insulating layer, and
- a through-via extending from the interconnection layer to the lower pad, wherein the interconnection layer includes a sequential stack of a plurality of metal layers,
wherein each metal layer of the plurality of metal layers includes at least one interconnection line and a via vertically overlapping with the at least one interconnection line,
wherein the upper pad is on an uppermost metal layer of the plurality of metal layers, and
wherein the capacitor includes a sequential stack, in the hole, of a first electrode, a first dielectric layer, a second electrode, a second dielectric layer and a third electrode.

17. The semiconductor device of claim 16, wherein
a lowermost metal layer of the plurality of metal layers includes a first power interconnection line, a second power interconnection line, and a third power interconnection line,
the first power interconnection line is electrically connected to the first electrode,
the second power interconnection line is electrically connected to the second electrode, and
the third power interconnection line is electrically connected to the third electrode.

18. The semiconductor device of claim 17, wherein
the semiconductor substrate includes a capacitor region, a first connection region, and a second connection region,
the capacitor is in the interlayer insulating layer on the capacitor region,
the first electrode extends onto a top surface of the interlayer insulating layer on the first connection region so as to be electrically connected to the first power interconnection line, and
the second electrode extends onto the top surface of the interlayer insulating layer on the second connection region so as to be electrically connected to the second power interconnection line.

19. The semiconductor device of claim 18, wherein
the first electrode has an opening on the second connection region, and the second electrode on the second connection region vertically overlaps with the opening.

20. The semiconductor device of claim 18, wherein
the capacitor includes a top electrode on the third electrode,
the top electrode completely fills the hole, and
the top electrode is electrically connected to the third power interconnection line on the capacitor region.

\* \* \* \* \*